(12) United States Patent
Aoki et al.

(10) Patent No.: US 7,767,516 B2
(45) Date of Patent: Aug. 3, 2010

(54) SEMICONDUCTOR DEVICE, MANUFACTURING METHOD THEREOF, AND MANUFACTURING METHOD OF ANTENNA

(75) Inventors: Tomoyuki Aoki, Tochigi (JP); Yuugo Goto, Isehara (JP)

(73) Assignee: Semiconductor Energy Laboratory Co., Ltd, Atsugi-shi, Kangawa-ken ( * ) Notice: Subject to any disclaimer, the term of this patent is extended or adjusted under 35 U.S.C. 154(b) by 231 days.

(21) Appl. No.: 11/920,273

(22) PCT Filed: May 29, 2006

(86) PCT No.: PCT/JP2006/311142

§ 371 (c)(1),
(2), (4) Date: Nov. 13, 2007

(87) PCT Pub. No.: WO2006/129817

PCT Pub. Date: Dec. 7, 2006

(65) Prior Publication Data

US 2009/0065588 A1  Mar. 12, 2009

(30) Foreign Application Priority Data

May 31, 2005  (JP) .............................. 2005-160192

(51) Int. Cl.
*H01L 21/8234* (2006.01)

(52) U.S. Cl. .................. 438/238; 438/666; 438/119; 438/668; 257/737; 257/778

(58) Field of Classification Search .............. 438/238, 438/666, 668, 119; 257/737, 778
See application file for complete search history.

(56) References Cited

U.S. PATENT DOCUMENTS 5,491,490 A  2/1996  Kim et al.

(Continued)

FOREIGN PATENT DOCUMENTS

EP  1 343 223  9/2003

(Continued)

OTHER PUBLICATIONS

International Search Report (Application No. PCT/JP2006/311142) dated Aug. 15, 2006.

(Continued)

*Primary Examiner*—Julio J Maldonado
*Assistant Examiner*—Wilner Jean Baptiste
(74) *Attorney, Agent, or Firm*—Eric J. Robinson; Robinson Intellectual Property Law Office, P.C.

(57) ABSTRACT

An element group having a transistor is formed over a substrate and a conductive film to be a dummy pattern is formed over the element group by pushing out a paste including conductive particles from a first opening portion, and then a conductive film functioning as an antenna is formed continuously thereafter so as to electrically connect with the transistor, by pushing out a paste including conductive particles from a second opening portion. Therefore, an element group having a transistor, provided over a substrate; a first conductive film functioning as an antenna provided over the element group and is electrically connected to the transistor; a second conductive film to be a dummy pattern provided to be adjacent to the first conductive film and is not electrically connected to the transistor; are included.

24 Claims, 14 Drawing Sheets

U.S. PATENT DOCUMENTS

| | | |
|---|---|---|
| 6,659,004 B2 | 12/2003 | Tagami |
| 6,784,853 B2 | 8/2004 | Ikramov et al. |
| 6,844,910 B2 | 1/2005 | Katsura |
| 6,940,223 B2 | 9/2005 | Yamazaki |
| 7,015,874 B2 | 3/2006 | Ikramov et al. |
| 7,044,373 B1 | 5/2006 | Garber et al. |
| 7,270,268 B2 | 9/2007 | Garber et al. |
| 2002/0029704 A1 | 3/2002 | Tagami |
| 2002/0100974 A1* | 8/2002 | Uchiyama .................. 257/737 |
| 2004/0164302 A1 | 8/2004 | Arai et al. |
| 2005/0130389 A1 | 6/2005 | Yamazaki et al. |

FOREIGN PATENT DOCUMENTS

| | | |
|---|---|---|
| EP | 1 643 589 | 4/2006 |
| EP | 1 343 223 | 6/2006 |
| JP | 02-020437 | 5/1990 |
| JP | 04-240819 | 8/1992 |
| JP | 06-268434 | 9/1994 |
| JP | 09-001970 | 1/1997 |
| JP | 3082712 | 8/2000 |
| JP | 2002-042551 | 2/2002 |
| JP | 2002-522849 | 7/2002 |
| JP | 2002-344146 | 11/2002 |
| JP | 2002-344226 | 11/2002 |
| JP | 2003-266630 | 9/2003 |
| JP | 2004-056665 | 2/2004 |
| JP | 2004-505481 | 2/2004 |
| JP | 2004-088508 | 3/2004 |
| JP | 2004-098500 | 4/2004 |
| JP | 2005-134942 | 5/2005 |
| WO | WO 00/10122 | 2/2000 |

OTHER PUBLICATIONS

Written Opinion (Application No. PCT/JP2006/311142) dated Aug. 15, 2006.

* cited by examiner

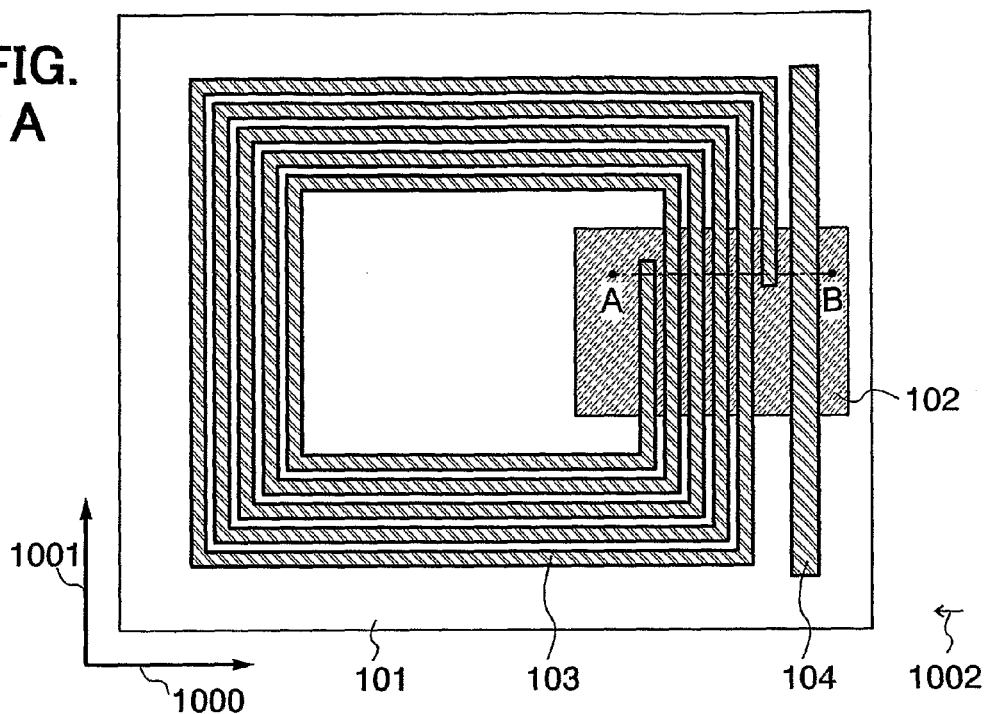
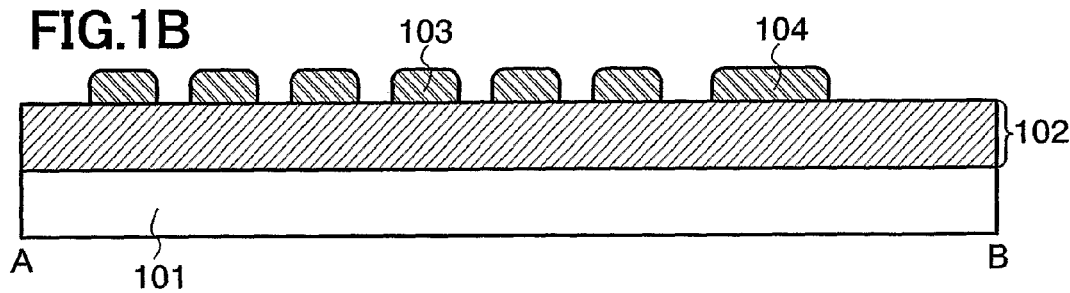
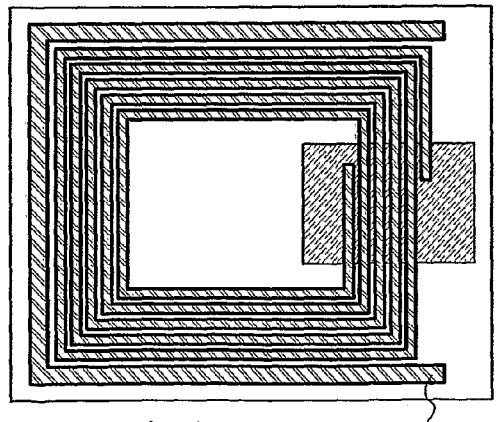
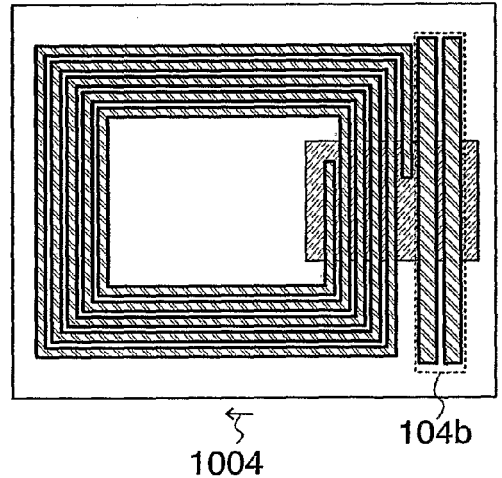

101　　103　104

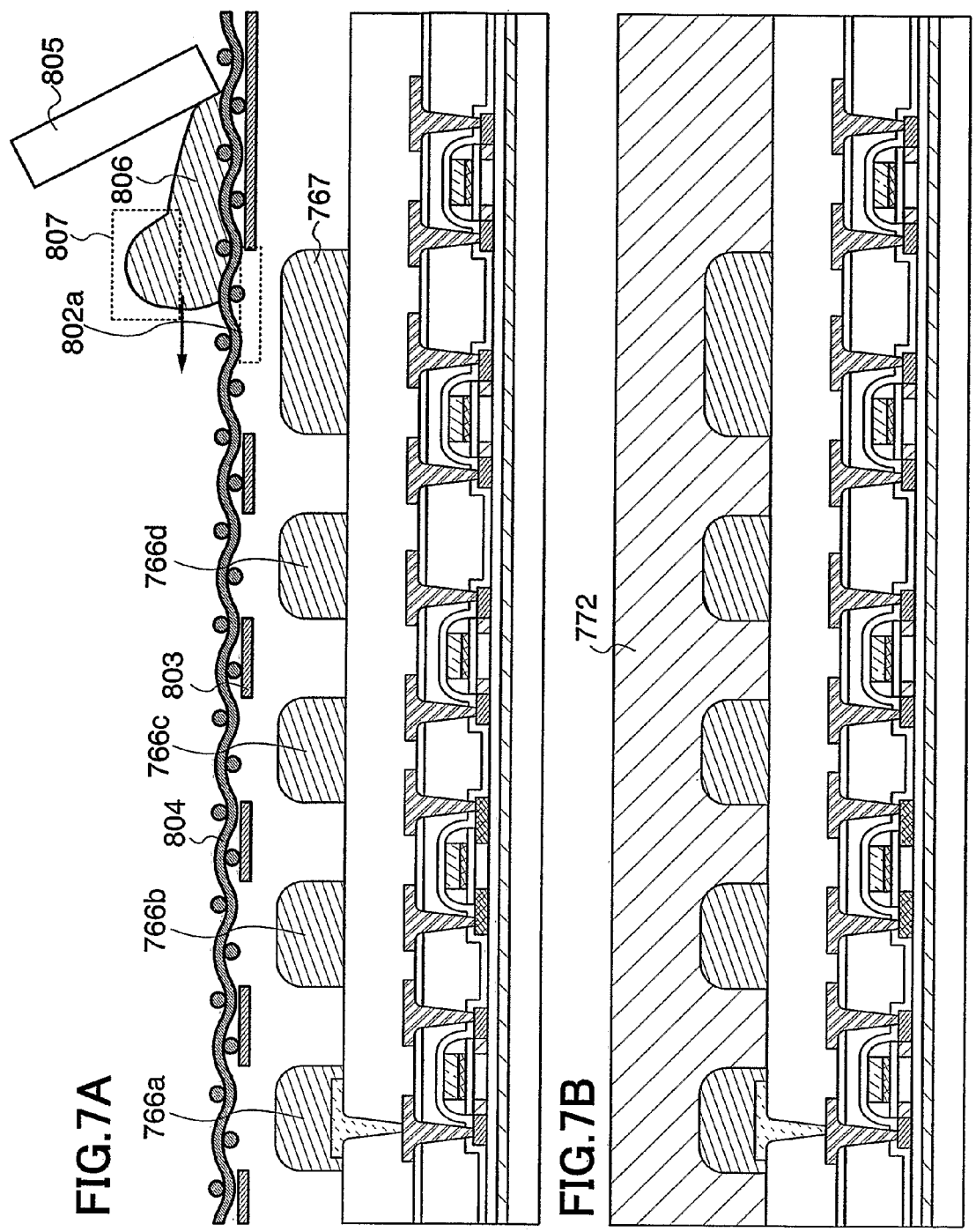

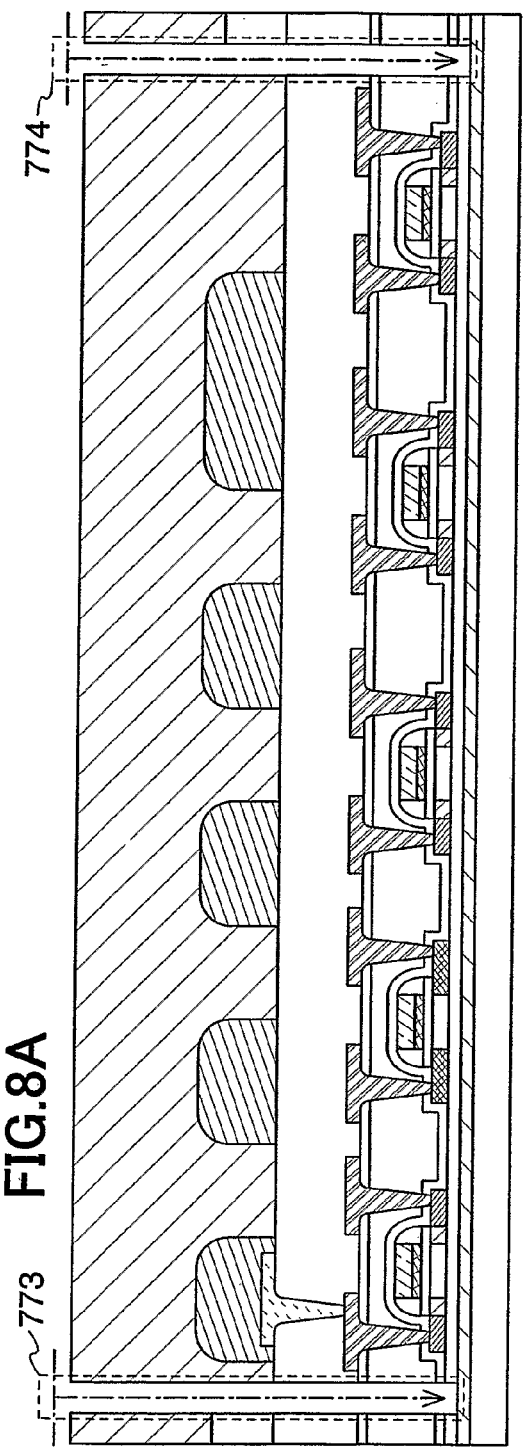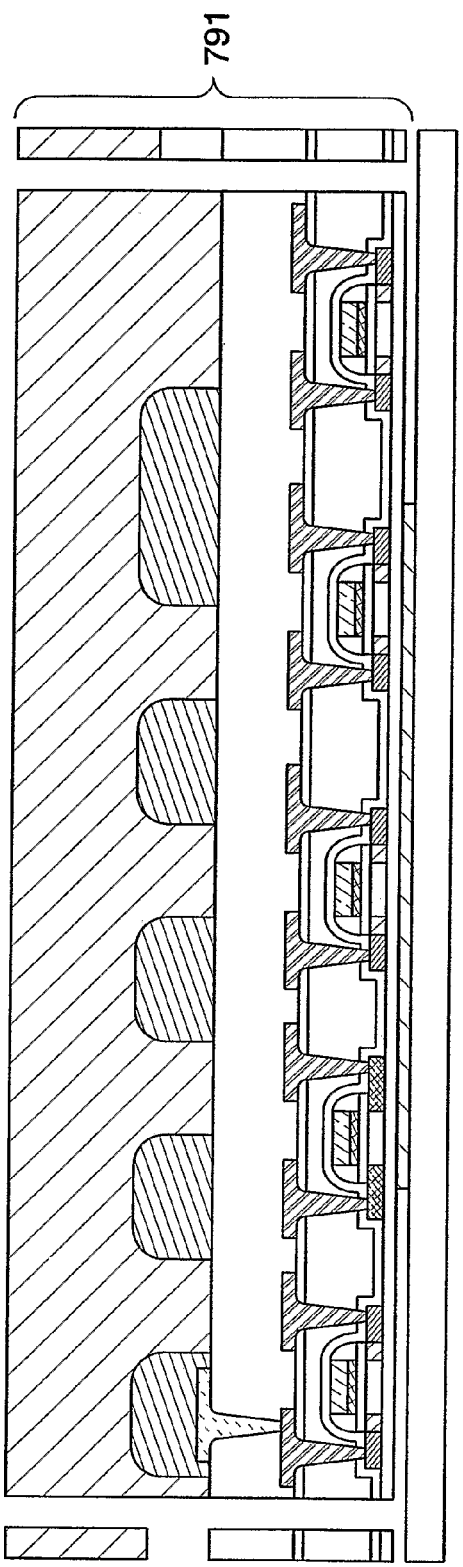

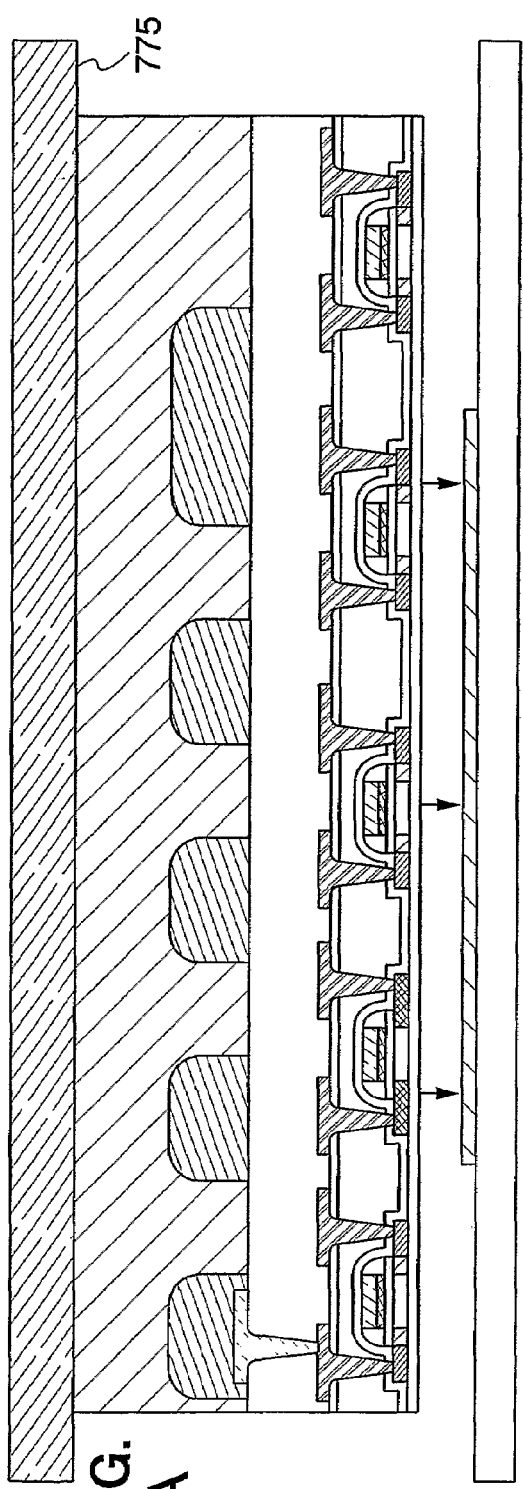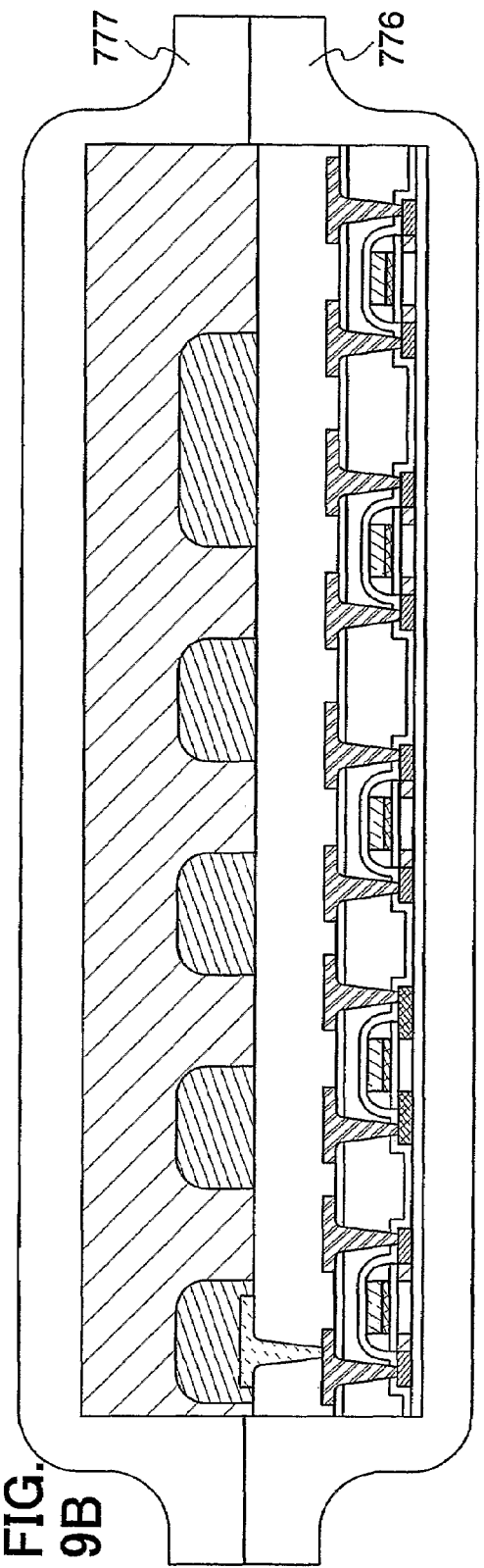

SEMICONDUCTOR DEVICE, MANUFACTURING METHOD THEREOF, AND MANUFACTURING METHOD OF ANTENNA

TECHNICAL FIELD

The present invention relates to a semiconductor device that is equipped with a conductive film functioning as an antenna and is capable of sending and receiving data without contact, as well as a manufacturing method of the semiconductor device.

BACKGROUND ART

In recent years, individual recognition technology has received a lot of attention. For example, there is a technology to be used for production, management, and the like in which information such as a history of the object is clarified by giving an ID (an individual recognition number) to an individual object. Above all, the development of semiconductor devices that can send and receive data without contact has been advanced. As such semiconductor devices, an RFID (Radio Frequency Identification) (also referred to as an ID tag, an IC tag, and IC chip, an RF (Radio Frequency) tag, a wireless tag, an electronic tag, or a wireless chip) and the like are beginning to be introduced into companies, markets, and the like.

Many semiconductor devices put to practical use today, such as RFID, include element groups having circuits including transistors and the like (also called IC (integrated circuit) chips) and conductive films functioning as antennas. These semiconductor devices can carry out data exchange between reader/writers via the antennas by electromagnetic waves.

In general, in the foregoing semiconductor devices, the conductive films functioning as antennas are formed using a method such as a winding method, an embedding method, a printing method, an etching method, a plating method or the like. Among these methods, using a screen printing method in particular is advantageous in terms of manufacturing cost and throughput, since the number of process steps and the number of necessary devices are small and a manufacturing method is relatively simple.

As shown in FIGS. 14A and 14B, the screen printing method is a method of forming a desired pattern on a surface of a printing object by using a screen printing plate 810, which has a wire netting (mesh) 804 and an emulsion 803 for a mask inside of a frame 801 and an opening portion 802 provided by selectively removing the emulsion 803, to push out a paste 806 by a squeegee 805, a roller, or the like over the printing object (here, an element group 102.)

In this manner, the screen printing method is widely used for formation steps of a conductive film, a pixel electrode, or the like included in a transistor or the like, in addition to, of course, a conductive film functioning as an antenna (for example, Patent Document 1: Japanese Patent Laid-Open No. H9-1970).

DISCLOSURE OF INVENTION

However, along with downsizing of semiconductor devices, it is necessary to provide a conductive film functioning as an antenna, a conductive film included in a transistor, and the like to be fine, and when a finely-formed conductive film is to be formed by a screen printing method, there is concern for a problem occurring such as a short circuit or a break in the conductive film. As such a problem, a variety of causes can be considered, and as one example, a cause such as the following can be considered. Note that here, as a specific example, one example of a problematic point when forming a coil-formed conductive film functioning as an antenna will be described with reference to FIGS. 14A to 14C.

In general, when a conductive film is to be provided using a screen printing method as shown in FIG. 14B, a conductive film of a desired pattern is formed over the element group 102 by the paste 806 getting pushed out by the squeegee 805, from the opening portion 802 provided in the emulsion 803. At this time, the paste 806 gets pushed out by the squeegee 805 from the opening portion 802 as it moves along a specific direction (here, a direction from B to A), and with the movement of the paste 806, a rising portion 807 (hereinafter referred to as an elevated portion 807) is formed at a peak of the paste 806.

For this reason, in the opening portion 802 where the paste 806 is pushed out first (here, the rightmost opening portion in FIGS. 14B (the B side, between A and B), the paste 806 is pushed out excessively because of the elevated portion 807; consequently, a conductive film 103$a$ with a wider width than that of a form of the opening portion is formed (see FIG. 14C). In this manner, when the conductive film with a wider width than that of a form of the opening portion is formed, a problem such as a short circuit occurs by the conductive film coming into contact with an adjacent conductive film 103$b$. On the other hand, in a case of widening a distance between opening portions and providing the conductive films in order to prevent the conductive films 103 coming into contact with each other, it becomes difficult to make a fine pattern by just that much. Further, in a case of making a width of the opening portion narrow and pushing out the paste, a width of a conductive film to be formed becomes narrow, and a problem such as disconnection and decrease in communication range occurs due to breaking and the like.

In view of the foregoing situation, in regards to a semiconductor device having a finely-formed antenna that is formed using a printing method such as a screen printing method, an object of the present invention is to provide a manufacturing method of a semiconductor device for which yield decrease is suppressed, as well as the semiconductor device.

The present invention implements the following means in order to achieve the foregoing object.

One feature of a manufacturing method of a semiconductor device of the present invention is to include the steps of: forming an element group having a transistor over a substrate, forming over the element group a first conductive film by pushing out a paste including conductive particles from a first opening portion of a screen printing plate, and then continuing to form a second conductive film by pushing out a paste including conductive particles from a second opening portion of the screen printing plate, so that the first conductive film is formed to be electrically insulated from the transistor, and so that the second conductive film is formed to be electrically connected to the transistor. In other words, the first conductive film is in a floating state and is capable of functioning as a dummy pattern as well as forming capacitance with the element group.

Another feature of a manufacturing method of a semiconductor device of the present invention is to include the steps of: forming an element group having a transistor over a first substrate, forming over a second substrate a first conductive film by pushing out a paste including conductive particles from a first opening portion of a screen printing plate, and then continuing to form a second conductive film functioning as an antenna by pushing out a paste including conductive particles from a second opening portion of the screen printing plate, so that the first conductive film is formed to be electrically insulated from the transistor, and so that the second conductive film formed over the second substrate is electrically connected to the transistor. Further, the first substrate and the second substrate can be stuck together so that the transistor and the second conductive film functioning as an antenna are electrically connected Also, another feature of a manufacturing method of a semiconductor device of the present invention is to include the steps of: forming, in the above structure, the first conductive film and the second conductive film functioning as an antenna by baking the paste that is pushed out from the first opening portion and the paste pushed out from the second opening portion.

Further, another feature of a manufacturing method of a semiconductor device of the present invention is to include the step of forming a width of a first conductive film to be wider than a width of a second conductive film functioning as an antenna.

One feature of a manufacturing method of an antenna of the present invention is to include the steps of: forming a first conductive film over a substrate by pushing out a paste including conductive particles from a first opening portion of a screen printing plate, and then continuing to form a second conductive film functioning as an antenna by pushing out a paste including conductive particles from a second opening portion of the screen printing plate.

One feature of a semiconductor device of the present invention is to include an element group having a transistor provided over a substrate; a first conductive film provided over the element group and is electrically insulated from the transistor; and a second conductive film functioning as an antenna provided adjacent to the first conductive film and is electrically connected to the transistor. In other words, the first conductive film is in a floating state and is capable of functioning as a dummy pattern as well as forming capacitance with the element group.

Another feature of a semiconductor device of the present invention is to include an element group having a transistor provided over a substrate; a first conductive film provided over the element group and is electrically insulated from the transistor; and a second conductive film functioning as an antenna provided adjacent to the first conductive film and is electrically connected to the transistor, wherein the second conductive film is provided in a coil form; the first conductive film is provided to be bent and has a first end portion and a second end portion; and the first end portion and the second end portion are not connected.

Another feature of a semiconductor device of the present invention is to include an element group having a transistor provided over a substrate; and a coil-formed conductive film functioning as an antenna provided over the element group and is electrically connected to the transistor; wherein a width of a portion of the conductive film positioned in an outermost circumference is wider than a width of a portion positioned on an inner side. The width of the portion of the conductive film positioned in the outermost circumference being wider that the width of the portion positioned on the inner side means that an average value of the width of the conductive film positioned in the outermost circumference is larger than an average value of the width of the conductive film positioned on the inner side.

When forming a conductive film or the like having a fine form by a screen printing method, by forming a conductive film that is a dummy pattern and then continuing to form a desired conductive film, the conductive film can be formed to be even. As a result, a short circuit between conductive films, a disconnection or the like can be prevented, and yield can be improved.

BRIEF DESCRIPTION OF DRAWINGS

In the accompanying drawings:

FIGS. 1A to 1D show an example of a semiconductor device of the present invention;

FIGS. 7A and 7B show an example of a manufacturing method of a semiconductor device of the present invention;

FIGS. 8A and 8B show an example of a manufacturing method of a semiconductor device of the present invention;

FIGS. 9A and 9B show an example of a manufacturing method of a semiconductor device of the present invention;

BEST MODE FOR CARRYING OUT THE INVENTION

Embodiment Modes

Figure 2A:
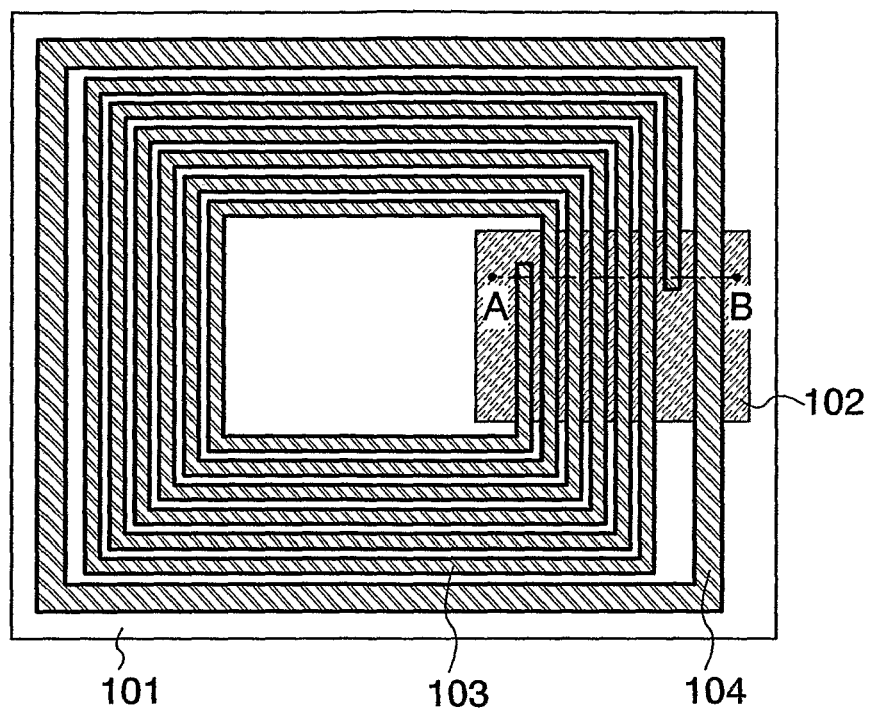
FIGS. 2A and 2B show an example of a semiconductor device of the present invention.

Embodiment modes of the present invention will be hereinafter be described with reference to drawings. However, the invention is not limited to the following description, and it is easily understood by those skilled in the art that the modes and details can be changed in various ways without departing from the spirit and scope of the invention. Therefore, the invention is not interpreted limited to the following description of embodiment modes. In the structure of the invention described hereinafter, reference numerals indicating the same things may be used in common in different drawings.

Embodiment Mode 1

In this embodiment mode, one example of a semiconductor device of the present invention is described with reference to drawings.

One example of a manufacturing method of a semiconductor device of the present invention is described hereinafter with reference to drawings.

Figure 3A:
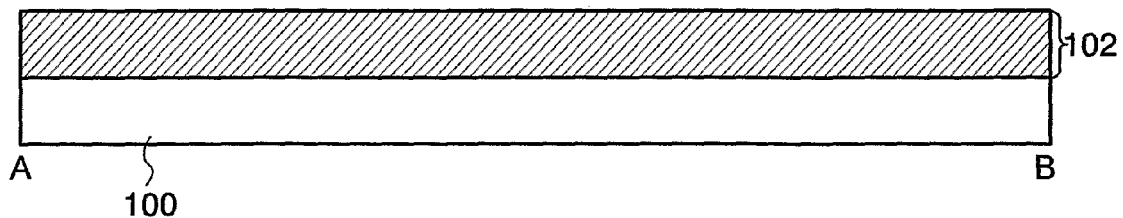
FIGS. 3A to 3C show an example of a manufacturing method of a semiconductor device of the present invention.

First, the element group 102 having a transistor and the like is provided over a substrate 101 (see FIG. 3A).

As a substrate 101, a glass substrate such as a barium borosilicate glass or an alumino borosilicate glass, a quartz substrate, a ceramic substrate, a metal substrate including stainless steel, or the like can be used. In addition, a semiconductor substrate of Si or the like may be used. Besides those, a substrate formed of a synthetic resin having flexibility such as acrylic or plastic represented by polyethylene terephthalate (PET), a polyethylene naphthalate (PEN), and a polyethersulfone (PES) can be also used. By using a flexible substrate, a bendable semiconductor device can be manufactured. Also, with such substrates, an area and a form thereof are not restricted so much; therefore, by using a rectangular substrate with at least one meter on a side as the substrate 101, for example, productivity can be drastically improved. This merit is greatly advantageous as compared to the case of using a round silicon substrate.

The element group 102 includes at least a transistor, and a vast array of integrated circuits such as a CPU, a memory or a microprocessor can be provided by the transistor. Specifically, the transistor included in the element group 102 can be provided by forming a thin film transistor (TFT) over the substrate 101 formed of glass, plastic or the like, or by forming a field effect transistor (FET) using a semiconductor substrate of Si or the like as the substrate 101 and using the semiconductor substrate as a channel region of the transistor. In addition, it is also possible that an SOI substrate is used as the substrate 101 and a transistor is formed over the substrate. Note that, in the case of using an SOI substrate, a transistor of the element group can be formed by using a method by bonding of an Si wafer or a method called SIMOX in which an insulating layer is formed inside by implanting oxygen ions in an Si substrate.

In a case of providing a thin film transistor, an amorphous semiconductor or a crystalline semiconductor can be used as a semiconductor film; however, when a thin film transistor having a higher property is used, a thin film transistor using a crystalline semiconductor is preferably provided. In this case, an amorphous semiconductor film is formed by a sputtering method, an LPCVD method, a plasma CVD method or the like, and then the amorphous semiconductor film is crystallized by a crystallization method (a laser crystallization method, a thermal crystallization method using an RTA or an annealing furnace, a thermal crystallization method using a metal element that promotes crystallization, a method in which the laser crystallization method is combined with the thermal crystallization method using a metal element that promotes crystallization, or the like) to form a crystalline semiconductor film.

As a structure of the thin film transistor, a single gate structure in which one channel forming region is formed, a double gate structure in which two channel forming regions are formed, a triple gate structure in which three channel forming regions are formed, or the like can be used. Also, it may be a bottom gate structure, or a dual gate type having two gate electrodes placed above and below the channel forming region via a gate insulating film.

Figure 3B:
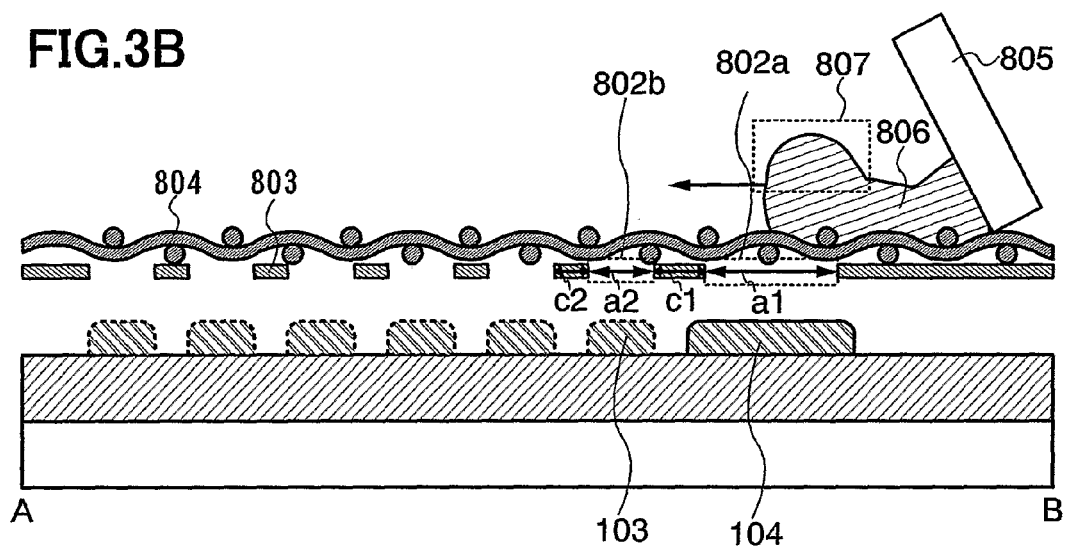

Subsequently, a conductive film 103 and a conductive film 104 are formed over the element group 102. Here, first, the conductive film 104 is formed to be electrically insulated from the element group 102 and the conductive film 103, using a screen printing method (see FIG. 3B). In other words, the conductive film 104 is in a floating state, and is capable of functioning as a dummy pattern as well as forming capacitance with the element group. A case of functioning as a dummy pattern is described hereinafter.

Specifically, taking into consideration a printing direction (moving direction of the squeegee 805 (here, B to A)), the conductive film 104 formed by the paste 806 being pushed out from an opening portion (here, the opening portion 802a) that it reaches first, is to be a dummy pattern. As the paste 806, a conductive paste may be used. As the conductive paste, a conductive paste in which conductive particles having a grain size of several nm to several ten μm are dissolved or dispersed in an organic resin can be used. As the conductive particles, one or more of metal particles such as silver (Ag), gold (Au), copper (Cu), nickel (Ni), platinum (Pt), palladium (Pd), tantalum (Ta), molybdenum (Mo), and titanium (Ti); fine particles of silver halide; or dispersible nanoparticles can be used. In addition, as the organic resin included in the conductive paste, one or more selected from organic resins functioning as a binder of metal particles, a solvent, a dispersing agent and a coating material can be used. Typically, organic resins such as an epoxy resin and a silicon resin can be given. When forming a conductive film, baking is preferably performed after the paste 806 is pushed out. For example, in the case where fine particles (of which the size is 1 nm or more but 100 nm or less) containing silver as its main component are used as a material for the paste, a conductive film can be obtained by stiffening the paste by baking at a temperature of 150 to 300° C. Also, fine particles containing solder, or lead-free solder as their main component may be used, and in this case fine particles of which the size is 20 μm or less is preferably used. Solder and lead-free solder have an advantage of being low cost.

As mentioned above, at a peak portion of the paste 806 which has been moved by the squeegee 805 for a certain distance over the emulsion 803 and the wire netting (mesh) 804 without being discharged, the elevated portion 807 is formed; therefore, extra paste in the amount of the elevated portion 807 is pushed out from the opening potion of the screen printing plate. For this reason, width and the like of the conductive film 104 formed by the paste which is pushed out from the opening potion 802a which the paste 806 reaches first is formed to be larger than a form of the opening portion 802a.

Figure 3C:
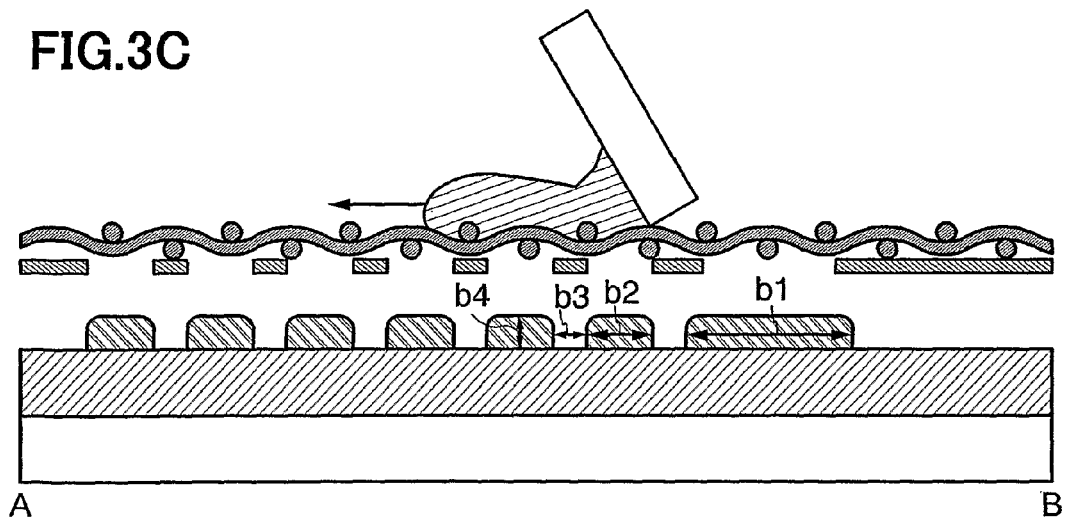

Then, after the conductive film 104 to be a dummy pattern is formed, the conductive film 103 is formed by continuing to move the squeegee 805 to push out the paste 806 from an opening portion 802b (see FIG. 3C).

In this manner, by forming the conductive film 104 to be a dummy pattern before forming the conductive film 103 functioning as an antenna, the conductive film 103 can be formed evenly in the form of the opening portion. This is because the elevated potion 807 is eliminated or alleviated by the paste being pushed out excessively from the opening portion 802a which the paste 806 reaches first, so that paste can be prevented from being pushed out excessively from the opening portion 802b thereafter, and a conductive film having a pattern exactly as the form of the opening portion 802b can be formed.

In this embodiment mode, it is preferable to form a width a1 of the opening portion 802a to be wider than a width a2 of the opening portion 802b, so that elimination or alleviation of the elevated portion 807 of the paste 806 can be improved. In this case, a width b1 of the conductive film 104 to be a dummy pattern is formed to be wider than a width b2 of the conductive film 103 functioning as an antenna.

When a distance between the opening portion 802a and the opening portion 802b is c1 and a distance between two opening portions 802b is c2, it is preferable to make c1 larger than c2 since a short circuit and the like between the conductive film 104 to be a dummy pattern and the conductive film 103 functioning as an antenna can be prevented. At this time, by making the width a1 of the opening portion 802a wider than the width a2 of the opening portion 802b, elimination or alleviation of the elevated portion 807 of the paste 806 can be improved even more, and a short circuit and the like between the conductive film 103 and the conductive film 104 can be prevented.

In order to achieve both downsizing of a semiconductor and expanding communication range thereof, it is necessary to form the conductive film 103 functioning as an antenna within a limited area, and in a case of providing the antenna in a coil form, it is effective to increase the number of times the antenna is wound. In order to increase the number of times the antenna is wound within the limited area, it is necessary to decrease a space between adjacent parts of the conductive film 103. In such a case, as mentioned above, by forming the conductive film 103 after forming the conductive film 104 to be a dummy pattern, the conductive film 103 can be provided in a desired form; therefore, the space between the adjacent parts of the conductive film 103 can be decreased.

For example, in a case of mounting a semiconductor device to a variety of products, a square of a rear surface of the semiconductor device is preferably 0.09 cm$^2$ to 4 cm$^2$. In a case of providing the semiconductor device in such size, in FIG. 3C, a space b3 between the adjacent parts of the conductive film 103 is preferably provided to be less than the a value that is half of the width b2 (b2×0.5) of the conductive film 103, and more preferably, the space b3 between the adjacent parts of the conductive film 103 is provided to be less than a value that is a quarter of the width b2 (b2×0.25) of the conductive film 103. Specifically, the width b2 of the conductive film 103 is provided to be 50 μm or more and 400 μm or less; preferably, 100 μm or more and 300 μm or less. Also, it is acceptable as long as the space b3 between the adjacent parts of the conductive film 103 satisfies the foregoing conditions, and for example, when the width b2 of the conductive film is provided at 200 μm, the space b3 between the adjacent parts of the conductive film 103 is provided to be 100 μm or less, preferably 50 μm or less.

Further, in order to prevent the adjacent parts of the conductive film 103 to come into contact with each other after forming the conductive film 103 by pushing out the paste 806, the space b3 between the adjacent parts of the conductive film 103 is preferably larger than a film thickness b4 of the conductive film 103. For example, when a film thickness of the conductive film 103 is provided to be 20 μm, the space b3 between the adjacent parts of the conductive film 103 is preferably provided to be 20 μm or more. Note that the film thickness b4 of the conductive film 103 refers to an average value of a film thickness in a cross-section of the conductive film 103.

By providing in the above manner, the conductive film 103 functioning as an antenna can be provided in a limited area, and downsizing of a semiconductor device and expanding communication range thereof can be achieved.

In the above manner, by forming the conductive film 104 to be a dummy pattern first and printing the elevated portion 807 of the paste 806 intentionally, the conductive film 103 functioning as an antenna can be formed evenly. Note that in FIGS. 3A to 3C, an example of providing the conductive film 104 as a dummy pattern in shown; however, it is also possible to form capacitance between the conductive film 104 and the element group 102.

Subsequently, one example of a semiconductor device of the present invention is described below with reference to drawings.

A semiconductor device of the present invention has at least the element group 102 formed over the substrate 101, the conductive film 103 functioning as an antenna provided over the element group 102, and the conductive film 104 provided as a dummy pattern (see FIG. 1A). The element group 102 has transistors, and the conductive film 103 functioning as an antenna is electrically connected to any of the transistors included in the element group 102. The electrical connection may be made in any manner, and for example, it can be made by partially exposing a wire that is electrically connected to the transistor, and forming the conductive film 103 on the wire. On the other hand, the conductive film 104 provided as a dummy pattern is placed in a periphery of the conductive film 103 functioning as an antenna, and it is provided so as not to be electrically connected to the transistors included in the element group 102. Also, the conductive film 103 and the conductive film 104 are provided using the same material. Note that in the structure shown in FIG. 1A, printing may be carried out from right to left along an X axis 1000, and in accordance with the foregoing manufacturing method. Note that 1001 is a Y axis, and 1002 is a printing direction.

The conductive film 103 may be provided in any form as long as it functions as an antenna. For example, as shown in FIGS. 1A to 1D, by providing the conductive film 103 in a coil form, a semiconductor device that is capable of sending/receiving data without contact using an electromagnetic induction type can be obtained.

The conductive film 104 may be provided in any form as long as it is placed so as to be adjacent to the conductive film 103. However, when the conductive film 104 to be a dummy pattern is provided so as to be parallel to an X axis direction or a Y axis direction, the conductive film 104 is preferably provided so as to be longer than the longest conductive film 103 on a side parallel to the X axis direction or the Y axis direction. For example, as shown in FIG. 1A, when a placement of the conductive film 103 is provided in a rectangular form, and the conductive film 104 is provided to be adjacent to one side out of four sides (for example, in FIG. 1A, the right side) of the conductive film 103, it is preferable to provide the conductive film 104 to be longer than a length of the one side of the conductive film 103.

Further, as a form of the conductive film to be a dummy pattern, it is not limited to a linear form as shown in FIG. 1A, and the conductive film 104a may have a bent form such as a square missing one side (see FIG. 1C) or it may be provided in a curved form or the like. Also, for the conductive film to be a dummy pattern, it is not limited to providing a single conductive film 104b, and a plurality of conductive films 104b can be provided (see FIG. 1D). Note that in the structure shown in FIG. 1C, a printing direction 1003 may be formed left to right along the X axis; top to bottom along the Y axis; or bottom to top along the Y axis; in accordance with the foregoing manufacturing method. In the structure shown in FIG. 1D, printing may be carried out from right to left along the X axis. Note that 1004 is a printing direction.

However, when the conductive film 103 functioning as an antenna is provided in a coil form, the conductive film 104 is preferably not provided to be circular (non-circular). This is because in a case where the conductive film 104 is provided so as to surround the conductive film 103 functioning as an antenna (see FIG. 2A), there is concern for problems such as decrease in communication range, when data is sent/received using electromagnetic induction type. When the conductive film 104 is provided non-circularly, for example in FIG. 1C, it is provided so that both end portions of the conductive film 104a in a bent form do not connect with each other.

Figure 2B:
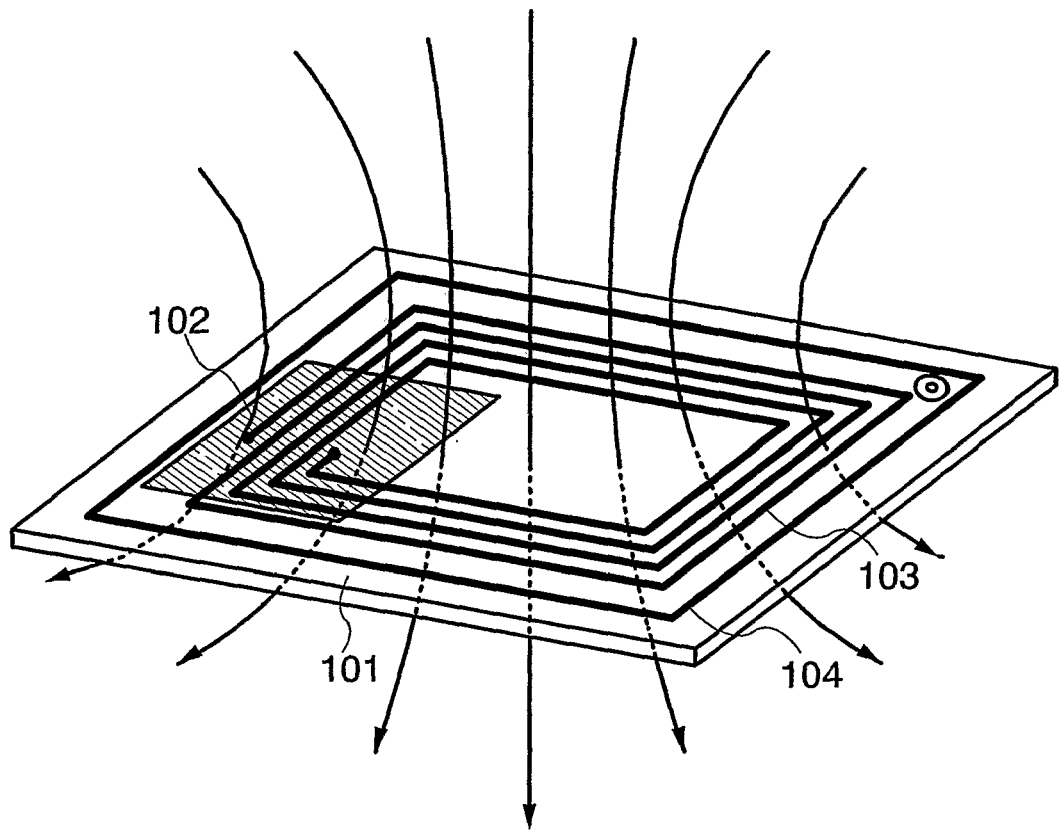

For example, as shown in FIG. 2B, when a magnetic field is generated in a region surrounded by the conductive film 103 or the conductive film 104 (in FIG. 2B, in a top-to-bottom direction on the page), current flows in the conductive film 103 and the conductive film 104 so as to cancel the generated magnetic field. Specifically, as shown in FIG. 2B, for example, when an electromagnetic wave is sent from a reader/writer to a semiconductor device (here, in a case where a magnetic field is generated from top to bottom of the substrate 101), the semiconductor device supplies a power supply voltage and a signal to the transistor and the like of the element group 102 via the conductive film 103 functioning as an antenna. On the other hand, although current also flows to the conductive film 104 to be a dummy pattern, a magnetic field (a magnetic field that is generated from the bottom of the substrate 101 towards the top) is generated by this current so as to cancel the electromagnetic wave sent from the reader/writer. As a result, by the magnetic field sent from the reader/writer getting cancelled by the magnetic field generated by the conductive film 104 to be a dummy pattern, a problem of a decrease in communication range occurs. For this reason, the conductive film 104 to be a dummy pattern is preferably provided so as not to be circular.

For example, as shown in FIG. 1C, the conductive film 104a is provided so as to have two end portions and so that the two end portions do not electrically connect.

Note that, in this embodiment mode, a case of forming a single conductive film 103 functioning as an antenna is shown; however, this embodiment mode is not limited thereto. For example, in a case of continuously forming a plurality of conductive films 103 functioning as antennas by continuously pushing out a paste from an opening portion of a screen printing plate for which a plurality of antenna patterns are formed, the aforementioned dummy pattern can be provided for every antenna of the plurality of antennas. Further, among the plurality of antennas, a dummy pattern may be provided before an antenna pattern from which the paste is pushed out first. A dummy pattern may be provided in regular intervals among the plurality of antennas. Also, when a plurality of antennas are formed over an element group which is formed over a substrate, is selectively cut off by a dicing method, a scribing method, or the like, and a plurality of semiconductor devices each having one antenna can be obtained. In addition, cutting off may be carried out by irradiating with laser light. In this case, when a dummy pattern is provided for every antenna of a plurality of antennas, the dummy pattern may remain in each of the plurality of semiconductor devices formed by cutting off.

In the above manner, by providing the conductive film to be a dummy pattern before forming the conductive film functioning as an antenna, an even conductive film can be formed. As a result, in a manufacturing method of a semiconductor device, improvement in yield can be achieved. Note that in this embodiment mode, an explanation relating to the conductive film functioning as an antenna is made; however, the manufacturing method can be similarly applied to a case of forming a conductive film such as a wiring pattern of a transistor by a screen printing method.

Embodiment Mode 2

In this embodiment mode, a structure of a semiconductor device of the present invention different from the structure in the above embodiment mode is described with reference to drawings.

Figure 4A:
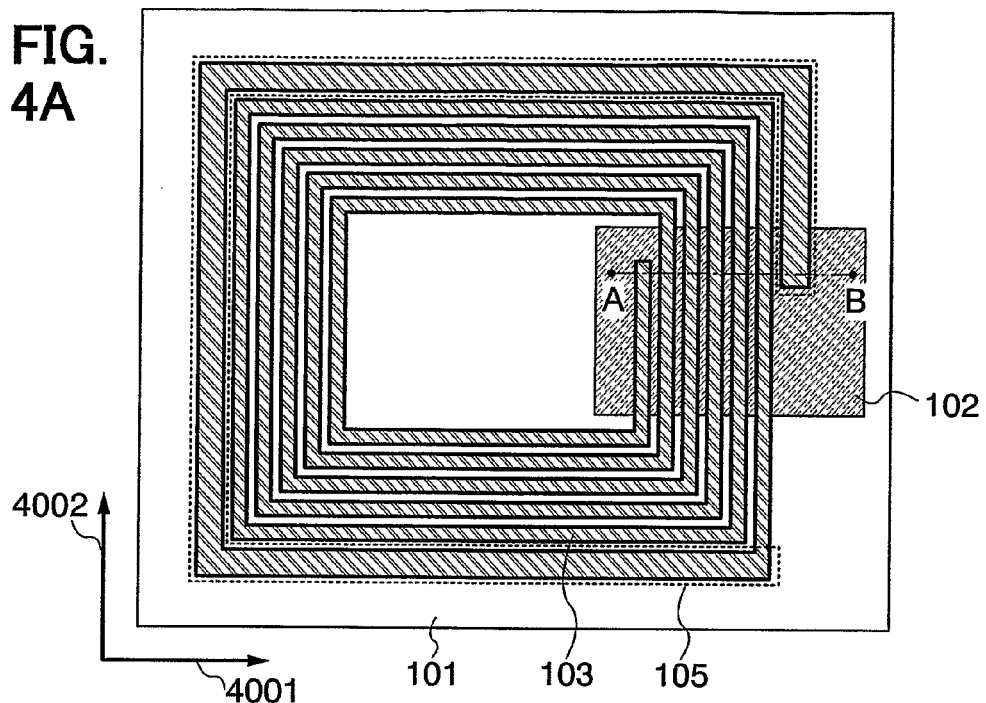
FIGS. 4A to 4D show an example of a semiconductor device of the present invention.
Figure 4B:
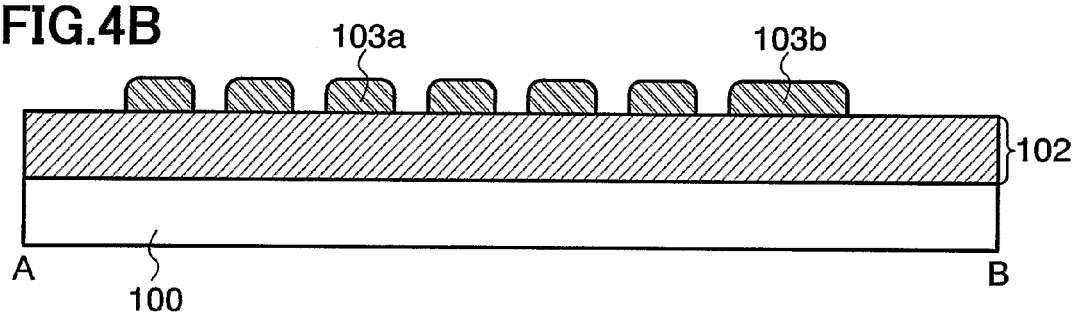

In a semiconductor device described in this embodiment mode, in the conductive film 103 functioning as an antenna, when the conductive film 103 is provided in a coil form, an average width of the conductive film positioned in an outermost circumference portion (a portion of the conductive film 103 formed on the outermost side) is provided to be wider than an average width of the conductive film formed on an inner side, so as to form the conductive film 105 (see FIGS. 4A and 4B). Note that FIG. 4B shows a schematic view of a cross-section between A and B of FIG. 4A. 4001 is an X axis, and 4002 is a Y axis.

Also, the width of the entire conductive film 103 positioned in the outermost circumference portion may be provided to be wider than the width of the conductive film formed on the inner side, or one portion of the conductive film 103 positioned in the outermost circumference portion may be provided to be wider than the width of the conductive film formed on the inner side In other words, an average value of the width of the conductive film positioned in the outermost circumference portion of the conductive film 103 may be provided to be wider than an average value of the width of the conductive film formed on the inner side. However, it is preferable to provide the conductive film 105 so that is it longer than the longest conductive film 103 on a side parallel to the X axis direction or the Y axis direction. For example, as shown in FIG. 4C, when a placement of the conductive film 103 is provided in a rectangular form, in the conductive film 103 of at least one side out of the four sides, the width of the conductive film 103c is preferably formed to be wider than the width of the conductive film formed on the inner side.

Also, the conductive film 103 can be formed by using a screen printing method as described in the foregoing Embodiment Mode 1. When it is formed by using a screen printing method, after forming the conductive film 104 positioned in the outermost circumference portion of the conductive film 103, the conductive film positioned on the inner side of it is formed. By forming the conductive film 104 beforehand, the elevated portion 807 of the paste 806 in the above FIG. 3B can be eliminated or alleviated and as a result the conductive film provided on the inner side can be formed evenly.

Figure 4C:
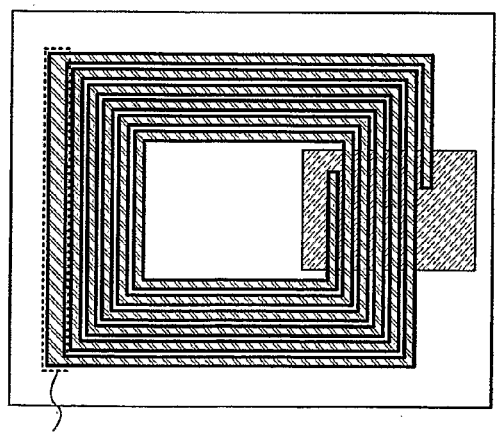
Figure 4D:
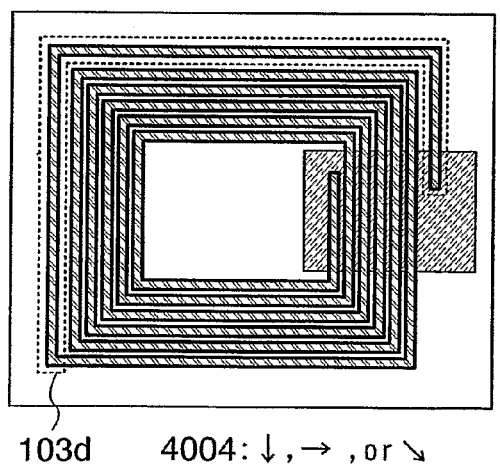

Also, a conductive film 103d positioned in the outermost circumference portion of the conductive film 103 functioning as an antenna can be provided away from the conductive film positioned on the inner side (see FIG. 4D). Specifically, at least one portion of the conductive film positioned in the outermost circumference portion is provided so that there is space between it and the conductive film provided on the inner side. The amount of space may be appropriately selected and decided by a practitioner; however, it is preferable that the space is more than a space between the conductive films formed on the inner side of the conductive film positioned on the outermost circumference.

Note that when the structures shown in FIGS. 4A to 4D is formed using the manufacturing method described in the above Embodiment Mode 1, for the structure shown in FIG. 4C, printing may be carried out from left to right along the X axis. Note that 4003 is a printing direction. Further, for the structure shown in FIG. 4D, printing may be carried out from left to right along the X axis; from top to bottom along the Y axis; or from top left to bottom right along the X axis and Y axis. Note that 4004 is printing directions.

In this manner, when forming the conductive film 103 functioning as an antenna using a screen printing method, by forming at least one portion of the conductive film positioned in the outermost circumference portion of the conductive film 103 so that its width is wider than the width of the conductive film positioned on the inner side, or forming so that it is away from the conductive film positioned on the inner side, it takes on a similar roles as that of the dummy pattern described in the above Embodiment Mode 1; therefore, a short circuit and the like from the conducive films coming into contact with each other can be suppressed, and decrease in yield can be prevented.

Note that this embodiment mode can be carried out by freely combining with the above Embodiment Mode 1.

Embodiment Mode 3

In this embodiment mode, one example of a manufacturing method of a semiconductor device of the present invention including a thin film transistor and an antenna is described with reference to drawings.

Figure 5A:
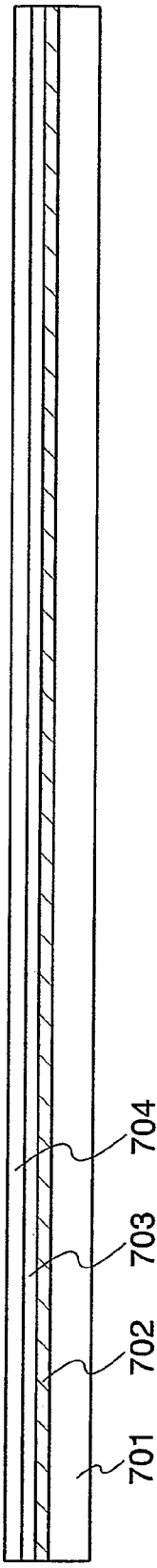
FIGS. 5A to 5C show an example of a manufacturing method of a semiconductor device of the present invention.

First, a peeling layer 702 is formed over a surface of a substrate 701. Subsequently, an amorphous semiconductor film 704 (for example, a film including amorphous silicon) is formed over the peeling layer 702 with an insulating film 703 therebetween (see FIG. 5A).

As the substrate 701, a glass substrate, a quartz substrate, a metal substrate, a stainless steel substrate, a plastic substrate having heat resistance against the treatment temperature of this step, or the like may be used. With such substrates, area and form thereof are not particularly restricted; therefore, by using a rectangular substrate with at least one meter on a side as the substrate 701, for example, productivity can be drastically improved. Such merit is greatly advantageous as compared to the case of using a round silicon substrate. Note that, the peeling layer 702 is formed over an entire surface of the substrate 701 in this step; however, the peeling layer 702 may be selectively provided as needed by etching using a photolithography method after the peeling layer is formed over the entire surface of the substrate 701. In addition, the peeling layer 702 is formed to be in contact with the substrate 701; however, an insulating film may be formed as a base film to be in contact with the substrate 701 as needed and the peeling layer 702 may be formed to be in contact with the insulating film.

As the peeling layer 702, a metal film, a laminated structure of a metal film and a metal oxide film, or the like may be used. The metal film is formed as a single layer or a laminated layer of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing the foregoing element as its main component. The film can be formed by a sputtering method, various CVD methods such as a plasma CVD method or the like, using these materials. As the laminated structure of a metal film and a metal oxide film, after the foregoing metal film is formed, an oxide of the metal film can be formed on the metal film surface by performing a plasma treatment in an oxygen atmosphere or a heating treatment in an oxygen atmosphere. For example, in the case where a tungsten film formed by a sputtering method is provided as a metal film, a metal oxide film of tungsten oxide can be formed on the tungsten film surface by performing a plasma treatment on the tungsten film. In this case, an oxide of tungsten is expressed in WOx, and x is 2 to 3. There are cases of x=2 ($WO_2$), x=2.5 ($W_2O_5$), x=2.75 ($W_4O_{11}$), x=3 ($WO_3$), and the like. When forming an oxide of tungsten, the values of x described above are not particularly restricted, and which oxide is to be formed may be decided based on an etching rate or the like. In addition, it is possible to form an oxide film on the metal film surface by performing a plasma treatment in the condition of high density (preferably $1\times10^{11}$ $cm^{-3}$ or more but $1\times10^{13}$ $cm^{-3}$ or less) using high frequency (a microwave or the like) and a low electron temperature (preferably 0.5 eV or more but 1.5 eV or less), (hereinafter the plasma in this condition is also referred to as "high-density plasma"). Furthermore, besides a metal oxide film, a metal nitride or a metal oxynitride may be used. In this case, a plasma treatment or a heating treatment is performed on the metal film in a nitrogen atmosphere or an atmosphere of nitrogen and oxygen. As for a condition of the plasma treatment, the foregoing one may be used.

As the insulating film 703, a single layer or a laminated layer of a film containing an oxide of silicon or a nitride of silicon is formed by a sputtering method, a plasma CVD method or the like. In the case where the base insulating film employs a two-layer structure, a silicon nitride oxide film may be formed as a first layer, and a silicon oxynitride film may be formed as a second layer, for example. In the case where the base insulating film employs a three-layer structure, a silicon oxide film, a silicon nitride oxide film, and a silicon oxynitride film may be formed as a first insulating film, a second insulating film, and a third insulating film, respectively. Alternatively, a silicon oxynitride film, a silicon nitride oxide film, and a silicon oxynitride film may be formed as a first insulating film, a second insulating film, and a third insulating film, respectively. The base insulating film functions as a blocking film for preventing the entry of an impurity from the substrate 701.

The amorphous semiconductor film 704 is formed with a thickness of 25 to 200 nm (preferably 30 to 150 nm), by a sputtering method, an LPCVD method, a plasma CVD method or the like.

Figure 5B:
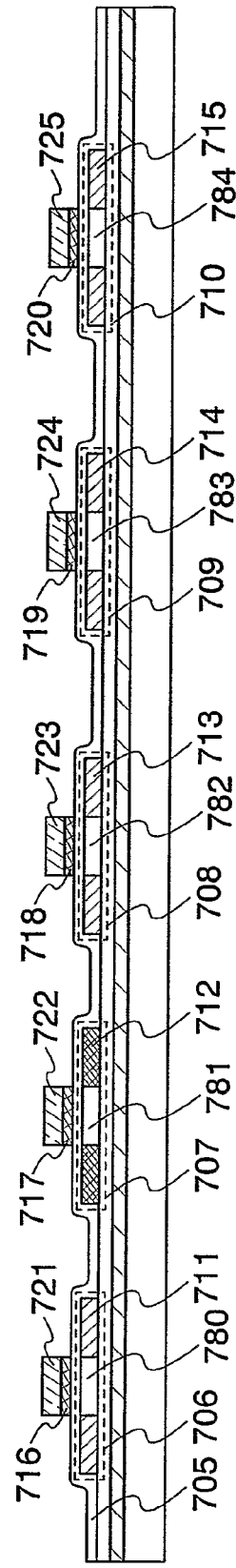

Next, the amorphous semiconductor film 704 is crystallized by a crystallization method (a laser crystallization method, a thermal crystallization method using an RTA or an annealing furnace, a thermal crystallization method using a metal element that promotes crystallization, a method in which the laser crystallization method is combined with the thermal crystallization method using a metal element that promotes crystallization, or the like) to form a crystalline semiconductor film. After that, the obtained crystalline semiconductor film is etched so as to have a desired form, thereby crystalline semiconductor films 706 to 710 are formed (see FIG. 5B).

An example of a manufacturing step of the crystalline semiconductor films 706 to 710 will be briefly described hereinafter. First, an amorphous semiconductor film is formed with a thickness of 66 nm by a plasma CVD method. Next, a solution containing nickel that is a metal element that promotes crystallization is retained on the amorphous semiconductor film, and a dehydrogenation treatment (at 500° C., for one hour) and a thermal crystallization treatment (at 550° C., for four hours) are performed on the amorphous semiconductor film, thereby a crystalline semiconductor film is formed. Subsequently, the crystalline semiconductor film is irradiated with laser light as needed, and a photolithography method is used to form the crystalline semiconductor films 706 to 710.

A continuous wave laser beam (a CW laser beam) or a pulsed wave laser beam (a pulsed laser beam) may be used. As a laser beam which can be used here, a laser emitted from one or a plurality of the following can be used: a gas laser such as an Ar laser, a Kr laser or an excimer laser; a laser of which the medium is monocrystalline YAG, $YVO_4$, forsterite ($Mg_2SiO_4$), $YAlO_3$, $GdVO_4$, or polycrystalline (ceramic) YAG, $Y_2O_3$, $YVO_4$, $YAlO_3$, $GdVO_4$, each added with one or more of Nd, Yb, Cr, Ti, Ho, Er, Tm and Ta as a dopant; a glass laser; a ruby laser; an alexandrite laser; a Ti: sapphire laser; a copper vapor laser; or a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd: $YVO_4$ laser (fundamental wave of 1064 nm) can be used. In this case, an energy density of about 0.01 to 100 $MW/cm^2$ (preferably, 0.1 to 10 $MW/cm^2$) of the laser is required. The scanning rate is set about 10 to 2000 cm/sec to irradiate the semiconductor film. Note that, a laser using, as a medium, microcrystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser; or a Ti: sapphire laser can be continuously oscillated. Furthermore, pulse oscillation thereof can be performed with an oscillation frequency of 10 MHz or more by carrying out Q switch operation or mode synchronization. When a laser beam is oscillated with an oscillation frequency of 10 MHz or more, a semiconductor film is irradiated with a subsequent pulse while the semiconductor film is melted and then solidified by the laser beam. Therefore, unlike in a case of using a pulsed laser with a low oscillation frequency, a solid-liquid interface can be continuously moved in the semiconductor film so that crystal grains, which continuously grow toward a scanning direction, can be obtained.

In addition, when the crystallization of the amorphous semiconductor film is performed by using the metal element that promotes crystallization, it is advantageous in that the crystallization can be performed at a low temperature in a short amount of time, and that the direction of crystals becomes uniform. On the other hand, there is a problem that the property is not stable because the off current is increased due to the remaining metal element in the crystalline semiconductor film. Therefore, it is preferable to form an amorphous semiconductor film functioning as a gettering site over the crystalline semiconductor film. In order to form a gettering site, the amorphous semiconductor film is required to contain an impurity element such as phosphorus or argon, and therefore, it is preferably formed by a sputtering method by which argon can be contained at a high concentration. After that, a heating treatment (an RTA method, thermal annealing using an annealing furnace, or the like) is performed to diffuse the metal element into the amorphous semiconductor film, and the amorphous semiconductor film containing the metal element is removed. In this manner, a contained amount of the metal element in the crystalline semiconductor film can be reduced or removed.

Next, a gate insulating film 705 covering the crystalline semiconductor films 706 to 710 is formed. As the gate insulating film 705, a single layer or a laminated layer of a film containing an oxide of silicon or a nitride of silicon is formed by a plasma CVD method, a sputtering method, or the like. Specifically, a film containing silicon oxide, a film containing silicon oxynitride, or a film containing silicon nitride oxide is formed as a single layer or a laminated layer.

Alternatively, the gate insulating film 705 may be formed by performing the foregoing high-density plasma treatment on the crystalline semiconductor films 706 to 710 to oxidize or nitride the surfaces. For example, the film is formed by a plasma treatment introducing a mixed gas of a rare gas such as He, Ar, Kr or Xe, and oxygen, nitrogen oxide (NO$_2$), ammonia, nitrogen, hydrogen or the like. When excitation of the plasma in this case is performed by introduction of a microwave, high density plasma can be generated at low electron temperature. By an oxygen radical (there is a case where an OH radical is included) or a nitrogen radical (there is a case where an NH radical is included) generated by this high-density plasma, the surface of the semiconductor film can be oxidized or nitrided.

By a treatment using such high-density plasma, an insulating film with a thickness of 1 to 20 nm, typically 5 to 10 nm, is formed over a semiconductor film. Since the reaction of this case is a solid-phase reaction, an interface state density between the insulating film and the semiconductor film can be extremely low. Since a high-density plasma treatment like this oxidizes (or nitrides) a semiconductor film (crystalline silicon, or polycrystalline silicon) directly, unevenness of a thickness of the insulating film to be formed can be extremely small, ideally. In addition, oxidation is not strengthened even in a grain boundary of crystalline silicon, which makes a very preferable condition. That is, by a solid-phase oxidization of the surface of the semiconductor film by the high-density plasma treatment shown here, an insulating film with good uniformity and low interface state density can be formed without causing oxidation reaction abnormally in a grain boundary.

As the gate insulating film, an insulating film formed by the high-density plasma treatment may be used by itself, or an insulating film of silicon oxide, silicon oxynitride, silicon nitride or the like may be deposited thereover by a CVD method using plasma or thermal reaction, so as to make a laminated layer. In any case, a transistor that is formed including an insulating film formed by high-density plasma, in a part of the gate insulating film or in the whole gate insulating film, can reduce unevenness of the property.

Also, the crystalline semiconductor films 706 to 710, obtained by irradiating a semiconductor film with a continuous wave laser or with a laser beam that oscillates at a frequency of 10 MHz or more as it is scanned in one direction to crystallize the semiconductor film, have a property of a crystal growing in the scanning direction of the beam. By placing a transistor so that the scanning direction is oriented to a channel length direction, and combining the above-mentioned gate insulating layer, a transistor (TFT) with few property fluctuation as well as high electric field effect mobility can be obtained.

Next, a first conductive film and a second conductive film are formed laminated over the gate insulating film 705. The first conductive film is formed with a thickness of 20 to 100 nm by a plasma CVD method, a sputtering method or the like, and the second conductive film is formed with a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb) or the like, or an alloy material or a compound material containing the foregoing element as its main component. Alternatively, they are formed of a semiconductor material represented by polycrystalline silicon doped with an impurity element such as phosphorus. As examples of a combination of the first conductive film and the second conductive film, a tantalum nitride (TaN) film and a tungsten (W) film, a tungsten nitride (WN) film and a tungsten film, a molybdenum nitride (MoN) film and a molybdenum (Mo) film, and the like can be given. Since tungsten and tantalum nitride have high heat resistance, a heating treatment for thermal activation can be performed after the first conductive film and the second conductive film are formed. In addition, in the case of a three-layer structure instead of a two-layer structure, a laminated structure of a molybdenum film, an aluminum film and a molybdenum film is preferably adopted.

Next, a resist mask is formed by a photolithography method, and an etching treatment for forming a gate electrode and a gate line is performed, so that conductive films (also referred to as gate electrodes) 716 to 725 functioning as gate electrodes are formed.

Next, a resist mask is formed by a photolithography method, and an impurity element giving N-type conductivity is added at low concentration to the crystalline semiconductor films 706 and 708 to 710, by an ion doping method or an ion implantation method, so that N-type impurity regions 711 and 713 to 715, and channel forming regions 780 and 782 to 784 are formed. As the impurity element giving N-type conductivity, an element which belongs to Group 15 may be used; for example, phosphorus (P) and arsenic (As) are used.

Next, a resist mask is formed by a photolithography method, and an impurity element giving P-type conductivity is added to the crystalline semiconductor film 707, so that a P-type impurity region 712 and a channel forming region 781 are formed. As the impurity element giving P-type conductivity, boron (B) is used, for example.

Figure 5C:
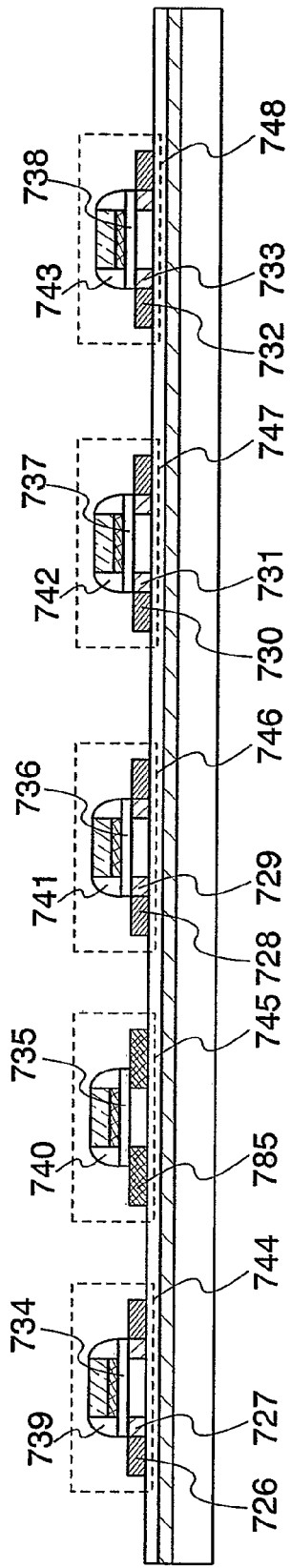

Next, an insulating film is formed so as to cover the gate insulating film 705 and the conductive films 716 to 725. The insulating film is formed as a single layer or a laminated layer of a film containing an inorganic material such as silicon, an oxide of silicon, or a nitride of silicon, or an organic material such as an organic resin, by a plasma CVD method, a sputtering method, or the like. Next, the insulating film is selectively etched by anisotropic etching mainly in a vertical direction, so that insulating films (also referred to as side walls) 739 to 743 which is in contact with the side surfaces of the conductive films 716 to 725 are formed (see FIG. 5C). Furthermore, simultaneously with the manufacture of the insulating films 739 to 743, insulating films 734 to 738 are formed by etching the gate insulating film 705. The insulating films 739 to 743 are used as masks for doping when LDD (Lightly Doped drain) regions are formed later.

Next, using a resist mask formed by a photolithography method and the insulating films 739 to 743 as masks, an impurity element giving N-type conductivity is added to the crystalline semiconductor films 706 and 708 to 710, so that first N-type impurity regions (also referred to as LDD regions) 727, 729, 731 and 733, and second N-type impurity regions 726, 728, 730 and 732 are formed. Concentration of an impurity element contained in the first N-type impurity regions 727, 729, 731 and 733 is lower than concentration of an impurity element contained in the second N-type impurity regions 726, 728, 730 and 732. Through the foregoing steps, N-type thin film transistors 744 and 746 to 748 and a P-type thin film transistor 745 are completed.

For forming an LDD region, there is a method using the insulating film that is a side wall as a mask. By using the insulating film that is a side wall as a mask, control of the width of the LDD region is easy, and the LDD region can be formed surely.

Figure 6A:
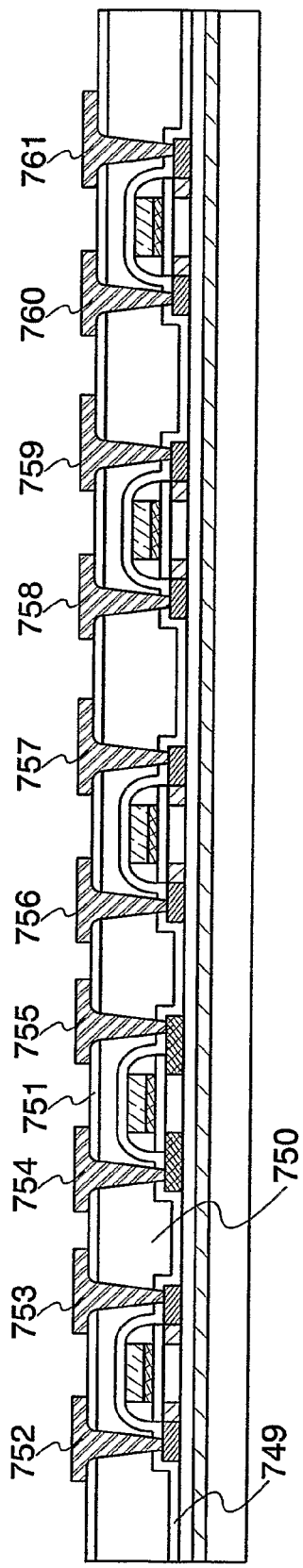
FIGS. 6A and 6B show an example of a manufacturing method of a semiconductor device of the present invention.

Subsequently, an insulating film is formed as a single layer or a laminated layer so as to cover the thin film transistors 744 to 748 (FIG. 6A). The insulating film covering the thin film transistors 744 to 748 is formed as a single layer or a laminated layer using an inorganic material such as an oxide of silicon or a nitride of silicon, an organic material such as polyimide, polyamide, benzocyclobutene, acrylic, epoxy or siloxane, or the like, by an SOG method, a droplet discharging method, or the like. A siloxane-based material is, for example, a substance including a skeleton of a bond of silicon and oxygen and including at least hydrogen as a substituent, or a substance including a skeleton of a bond of silicon and oxygen and at least one of fluorine, an alkyl group, aromatic carbon hydride as a substituent. For example, in the case where the insulating film covering the thin film transistors 744 to 748 has a three-layer structure, a film containing silicon oxide is formed as a first-layer insulating film 749, a film containing a resin is formed as a second-layer insulating film 750, and a film containing silicon nitride is formed as a third-layer insulating film 751.

Note that before the insulating films 749 to 751 are formed or after one or more of thin films of the insulating films 749 to 751 are formed, a heating treatment for recovering the crystallinity of the semiconductor film, for activating the impurity element which has been added into the semiconductor film, or for hydrogenating the semiconductor film is preferably performed. For the heating treatment, a thermal annealing method, a laser annealing method, an RTA method, or the like is preferably adopted.

Next, the insulating films 749 to 751 are etched by a photolithography method; thereby contact holes are formed to expose the N-type impurity regions 726 and 728 to 732 and the P-type impurity region 785. Subsequently, a conductive film is formed so as to fill the contact holes and patterned to form conductive films 752 to 761 each functioning as a source wiring or a drain wiring.

The conductive films 752 to 761 are formed as a single layer or a laminated layer using an element selected from titanium (Ti), aluminum (Al), and neodymium (Nd), or an alloy material or a compound material containing the foregoing element as its main component by a plasma CVD method, a sputtering method, or the like. An alloy material containing aluminum as its main component corresponds to a material containing nickel which its main component is aluminum or an alloy material containing nickel and one or both of carbon and silicon which its main component is aluminum, for example. Each of the conductive films 752 to 761 preferably employs, for example, a laminated layer structure of a barrier film, an aluminum-silicon (Al—Si) film, and a barrier film, or a laminated layer structure of a barrier film, an aluminum-silicon (Al—Si) film, a titanium nitride (TiN) film and a barrier film. Note that a barrier film corresponds to a thin film formed by using titanium, a nitride of titanium, molybdenum, or a nitride of molybdenum. Aluminum and aluminum silicon which have low resistance and are inexpensive are optimal materials for forming the conductive films 752 to 761. In addition, generation of a hillock of aluminum or aluminum-silicon can be prevented when upper and lower barrier layers are provided. Furthermore, when the barrier film is formed by using titanium that is a highly-reducible element, even if a thin natural oxide film is formed over the crystalline semiconductor film, the natural oxide film is reduced so that preferable contact with the crystalline semiconductor film can be obtained.

Figure 6B:
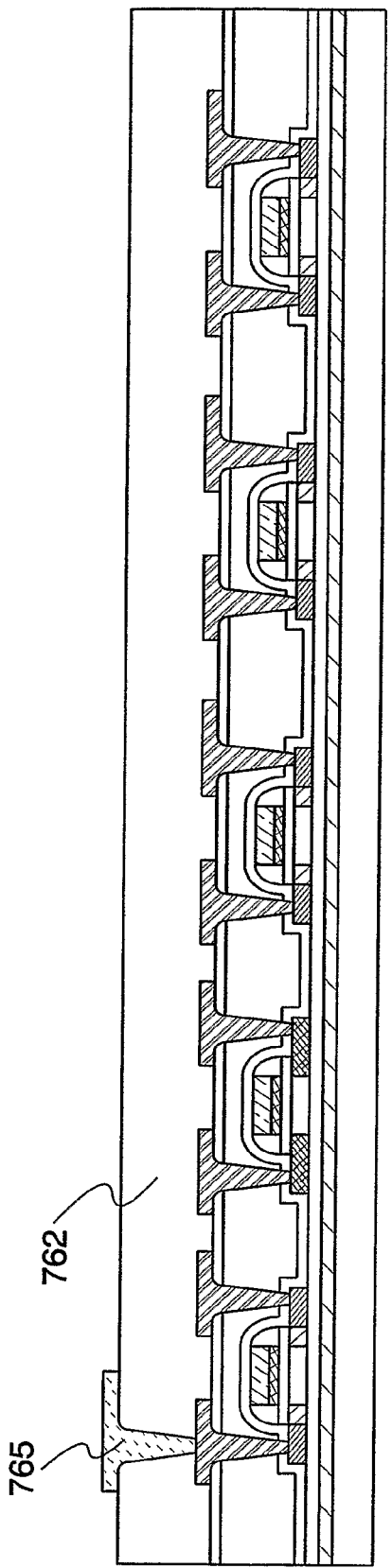

Next, an insulating film 762 is formed so as to cover the conductive films 752 to 761 (FIG. 6B). The insulating film 762 is formed as a single layer or a laminated layer using an inorganic material or an organic material by an SOG method, a droplet discharging method, or the like. The insulating film 762 is preferably formed with a thickness of 0.75 to 3 μm.

Subsequently, the insulating film 762 is etched by a photolithography method, so that a contact hole to expose the conductive film 752 is formed. Then, a conductive film is formed so as to fill the contact hole. The conductive film is formed by a plasma CVD method, a sputtering method, or the like, by using a conductive material. Then, the conductive film is patterned to form a conductive film 765. Note that the conductive film 765 becomes a connection part with the conductive film functioning as an antenna. Therefore, the conductive film 765 is preferably formed as a single layer or a laminated layer using titanium, or an alloy material or a compound material containing titanium as its main component. In addition, in the photolithography step for forming the conductive film 765, it is preferable to perform wet etching in order to prevent damage to the thin film transistors 744 to 748 in lower layers; hydrogen fluoride (HF) or an ammonia peroxide mixture is preferably used as the etchant.

Next, a conductive film 766a to 766d functioning as an antenna, in contact with the conductive film 765, and a conductive film 767 functioning as a dummy pattern, are formed (FIG. 7A). The conductive film 766a to 766d and the conductive film 767 are formed by using a screen printing method as described in the foregoing embodiment mode. Here, it is formed using a paste including silver (Ag), and by carrying out a heating treatment at 50 to 350° C. thereafter. Also, in the foregoing step, the conductive film 766a can be provided in a contact hole that directly exposes the conductive film 752, instead of forming the conductive film 765.

Next, an insulating film 772 functioning as a protective film is formed so as to cover the conductive film 766a to 766d functioning as an antenna and the conductive film 767, by an SOG method, a droplet discharging method or the like (FIG. 7B). The insulating film 772 is formed of a film containing carbon such as DLC (diamond-like carbon), a film containing silicon nitride, a film containing silicon nitride oxide, or an organic material, and preferably it is formed of an epoxy resin.

Next, an element forming layer 791 is peeled from the substrate 701. Peeling of the element forming layer 791 is performed by using physical force, after selectively irradiating the element forming layer 791 with laser light and forming opening portions 773 and 774 (FIG. 8A). Alternatively, as another method, the peeling may be performed after forming the opening portions 773 and 774 to expose the peeling layer 702 and then introducing an etchant to remove the peeling layer 702 (FIG. 8B). As the etchant, a gas or a liquid containing halogen fluoride or an interhalogen compound is used; for example, chlorine trifluoride ($ClF_3$) is used as a gas containing halogen fluoride. Accordingly, the element forming layer 791 is peeled from the substrate 701. Note herein that the element forming layer 791 includes an element group including the thin film transistors 744 to 748 and the memory element portions 789 and 790, and the conductive film 786 functioning as an antenna. The peeling layer 702 may be partially left instead of being removed entirely. By leaving a part of the peeling layer 702, consumption of the etchant can be reduced and time for removing the peeling layer can be shortened. In addition, the element forming layer 791 can be retained at the substrate 701 even after the peeling layer 702 is removed.

It is preferable to reuse the substrate 701 after the element forming layer 791 is peeled off, in order to reduce the cost. In addition, the insulating film 722 is formed to prevent the element forming layer 791 from scattering after the peeling layer 702 is removed. The element forming layer 791 which is small, thin, and light, easily scatters after the peeling layer 702 is removed, since it is not attached firmly to the substrate 701. However, by forming the insulating film 772 over the element forming layer 791, the element forming layer 791 is weighted and scattering from the substrate 701 can be prevented. In addition, by forming the insulating film 772, the element forming layer 791 which is in itself thin and light is prevented from rolling up by stress or the like after being peeled from the substrate 701, and the strength thereof can be ensured to some degree.

Next, one surface of the element forming layer 791 is attached to a first sheet material 775, and the element forming layer 791 is completely peeled from the substrate 701 (FIG. 9A). In the case where the peeling layer 702 is left partially without being removed completely, the element forming layer is peeled from the substrate 701 by a physical means. Then, a second sheet material 776 is provided over the other surface of the element forming layer 791, and one or both of a heating treatment and a pressure treatment are performed to attach the second sheet material 776. Simultaneously with or after providing the second sheet material 776, the first sheet material 775 is peeled and a third sheet material 777 is provided instead. Then, one or both of a heating treatment and a pressure treatment are performed to attach the third sheet material 777. Accordingly, a semiconductor device which is sealed with the second sheet material 776 and the third sheet material 777 is completed (FIG. 9B).

Note that the sealing may be performed with the first sheet material 775 and the second sheet material 776; however, in the case where a sheet material used for peeling the element forming layer 791 from the substrate 701 is different from a sheet material used for sealing the element forming layer 791, the element forming layer 791 is sealed with the second sheet material 776 and the third sheet material 777 as described above. This is effective in the case where a sheet material having low adhesion is desirable to be used, such as the case where the first sheet material 775 may adhere not only to the element forming layer 791 but also to the substrate 701 when the element forming layer 791 is peeled from the substrate 701.

As the second sheet material 776 and the third sheet material 777 used for sealing, a film formed by using polypropylene, polyester, vinyl, polyvinyl fluoride, polyvinyl chloride, or the like, paper of a fibrous material, a laminated film of a base film (polyester, polyamide, an inorganic vapor deposition film, paper, or the like) and an adhesive synthetic resin film (an acrylic-based synthetic resin, an epoxy-based synthetic resin, or the like), or the like can be used. Note that the foregoing film is attached to a treatment object by performing a heating treatment and a pressure treatment, and the treatments are performed in the following manner: an adhesive layer which is provided on the outermost surface of the film or a layer (not an adhesive layer) which is provided on the outermost layer thereof is melted by the heating treatment, and then pressure is applied, thereby the film is attached. Note that an adhesive layer may be provided over a surface of the second sheet material 776 or the third sheet material 777, but is not necessarily provided. The adhesive layer corresponds to a layer containing an adhesive such as a heat curable resin, an ultraviolet-curable resin, an epoxy resin-based adhesive or a resin additive. In addition, it is preferable to perform silica coating to the sheet material used for sealing in order to prevent moisture and the like from entering inside after the sealing; for example, a sheet material in which an adhesive layer, a film of polyester or the like, and a silica coat are laminated can be used.

Note that this embodiment mode can be implemented freely combining with the foregoing Embodiment Modes 1 and 2. That is, the materials and the forming methods described in the foregoing embodiment modes can also be used in this embodiment mode while the materials and the forming methods described in this embodiment mode can also be used in the foregoing embodiment modes.

Embodiment Mode 4

In this embodiment mode, a semiconductor device different from the semiconductor device of the above embodiment mode is described using drawings. Specifically, a case of providing an element group and an antenna forming layer by separately manufacturing them, and then connecting the element group and the antenna forming layer is described.

Figure 10A:
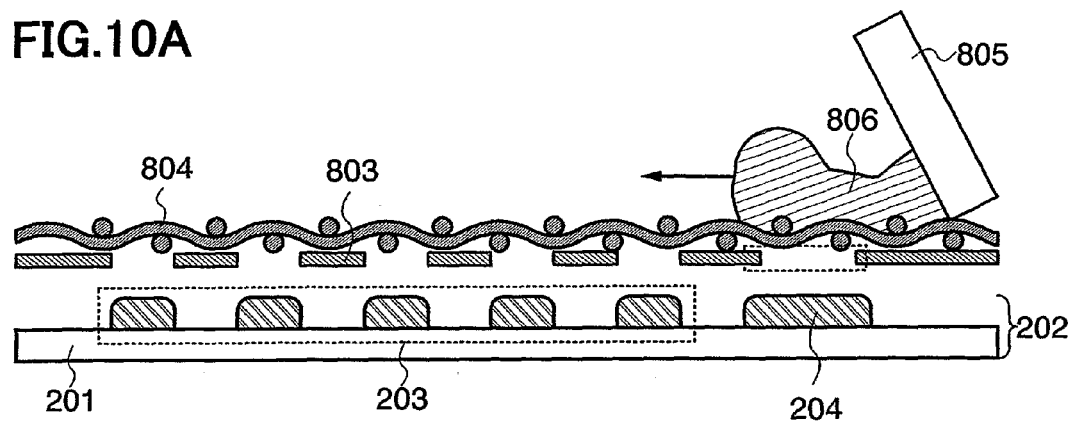
FIGS. 10A to 10C show an example of a manufacturing method of a semiconductor device of the present invention.

For an antenna forming layer 202, a conductive film 203 functioning as an antenna and a conductive film 204 to be a dummy pattern are formed over a substrate 201 by a screen printing method described in the above embodiment mode (see FIG. 10A). Note that here, an example of providing the conductive film 204 to be a dummy pattern is shown; however, as shown in the above Embodiment Mode 2, a conductive film of the outermost circumference of the conductive film 203 functioning as an antenna can be provided by being selectively formed to be wide. On the other hand, the element group 210 can be formed by providing a thin film transistor 213 over a substrate 211 with an insulating film 212 therebetween, using a method shown in the above embodiment mode.

Figure 10B:
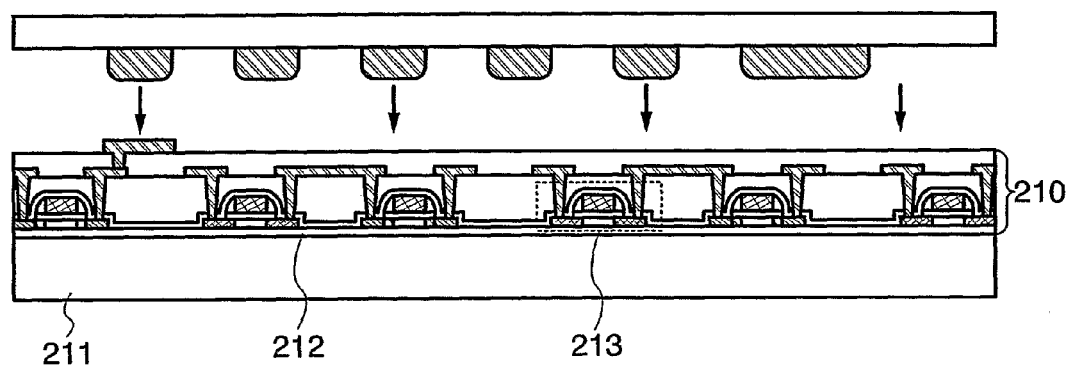
Figure 10C:
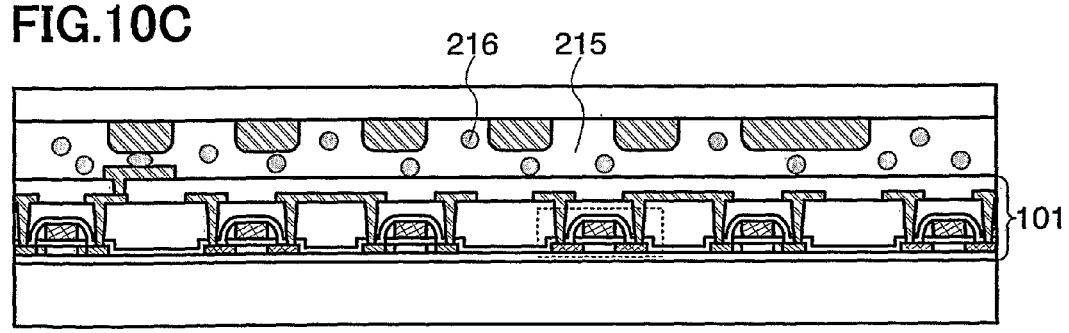

Subsequently, the substrate 201 and the substrate 211 are stuck together so that the thin film transistor 213 provided over the substrate 211 and the conductive film 203 functioning as an antenna provided over the substrate 201 are electrically connected (see FIG. 10B). Here, by using conductive particles 216 contained in an adhesive resin 215, connection of the thin film transistor 213 and the conductive film 203 functioning as an antenna is carried out (see FIG. 10C). Here, an example of electrically connecting the element group 210 and the antenna forming layer 202 using conductive particles is described; however, a conductive adhesive such as a silver paste, a copper paste, or a carbon paste; an anisotropic conductive adhesive such as ACP (anisotropic conductive paste); a solder joint; or the like can be used for the connection.

As the substrates 201 and 211, a glass substrate, a quartz substrate, a metal substrate or a stainless steel substrate, or a flexible substrate such as a plastic substrate having heat resistance against the treatment temperature of this step may be used. With such substrates, an area and a form thereof are not particularly restricted; therefore, by using a rectangular substrate with at least one meter on a side as the substrate, for example, productivity can be drastically improved.

By the above step, a semiconductor device formed by sticking together an element group and an antenna forming layer formed separately can be obtained. Note that in FIGS. 10A to 10C, an example of providing the thin film transistor for the element group is described; however, it is not limited thereto, and an field effect transistor (FET) using an Si semiconductor substrate or the like for the element group can be used. A case of this is described using FIGS. 11A and 11B.

First, the antenna forming layer 202 is formed by providing the conductive film 203 functioning as an antenna and the conductive film 204 to be a dummy pattern over the substrate 201 using a screen printing method. A form of the conductive film 203 functioning as an antenna may be provided in any way, for example, when using an electromagnetic induction type, it may be provided in a coil form as described in the above embodiment mode; and when using an electric wave method, length of the conductive film 203 is appropriately set by taking into consideration a wavelength of an electromagnetic wave that is applied. Further, instead of providing the conductive film 204 to be a dummy pattern, a width of a conductive film on an outermost circumference portion may be formed to be selectively wide, as described in the above Embodiment Mode 2.

The element group 210 is herein provided by using a semiconductor substrate formed of monocrystalline Si as the substrate 211, and forming a field effect transistor (FET) (hereinafter referred to as a transistor 223) using the semiconductor substrate as a channel region.

Figure 11A:
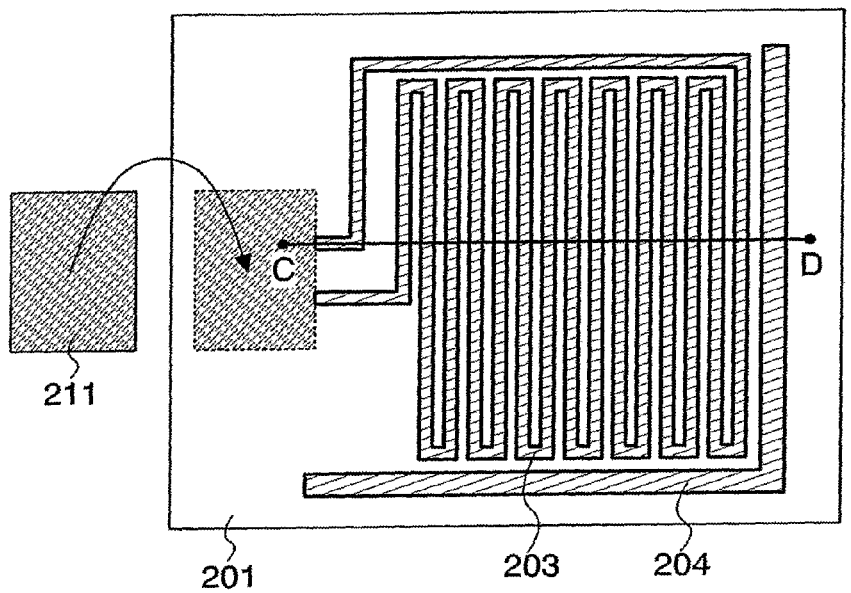
FIGS. 11A and 11B show an example of a semiconductor device of the present invention.
Figure 11B:
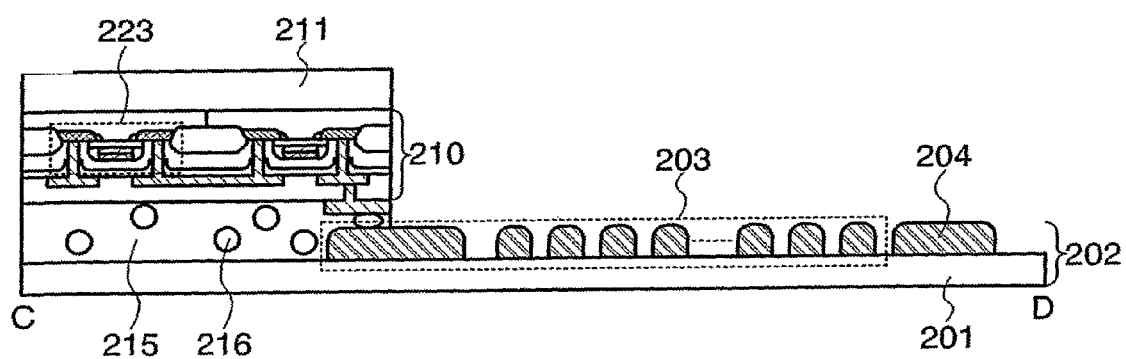

After separately providing each of the antenna forming layer 202 and the element group 210, the substrate 201 and the substrate 211 are stuck together so that the transistor 223 formed over the substrate 211 and the conductive film 203 functioning as an antenna formed over the substrate 211 are electrically connected to each other (see FIG. 11A). Here, by using the conductive particles 216 contained in the adhesive resin 215, connection of the transistor 223 and the conductive film 203 functioning as an antenna is carried out (see FIG. 11B). Here, an example of electrically connecting the element group 210 and the antenna forming layer 202 using conductive particles is described; however, a conductive adhesive such as a silver paste, a copper paste, or a carbon paste; an anisotropic conductive adhesive such as ACP (anisotropic conductive paste); a solder joint; or the like can be used for the connection.

Further, when providing a flexible semiconductor device, it is favorable to thin the substrate 211 of the transistor 223 by grinding or polishing. Also, in FIGS. 10A to 10C, when using a glass substrate as the substrate 211, it is favorable to thin the glass substrate 211 by grinding or polishing.

This embodiment mode can be carried out by freely combining with the foregoing Embodiment Modes 1 to 3. For example, as a form of the conductive film 203 functioning as an antenna or the conductive film 204 to be a dummy pattern, any structure described in the foregoing Embodiment Modes 1 to 3 can be combined and used.

Embodiment Mode 5

Figure 12A:
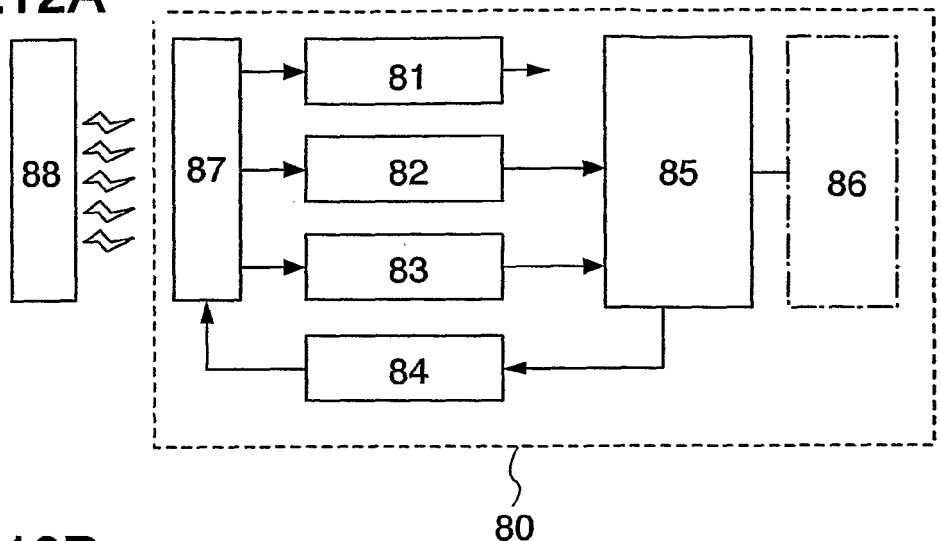
FIGS. 12A to 12C each show an example a type of usage of a semiconductor device of the present invention.
Figure 12B:
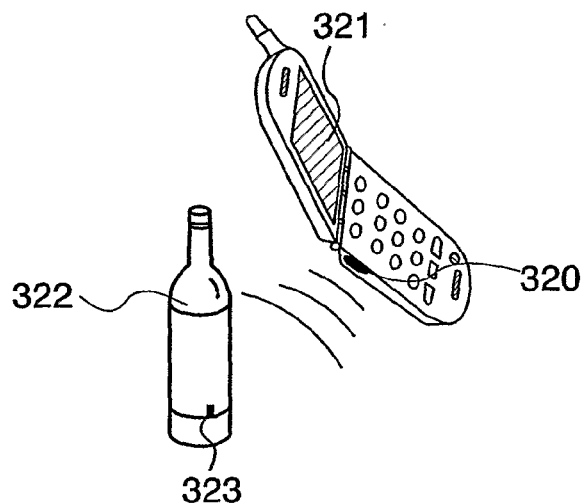
Figure 12C:
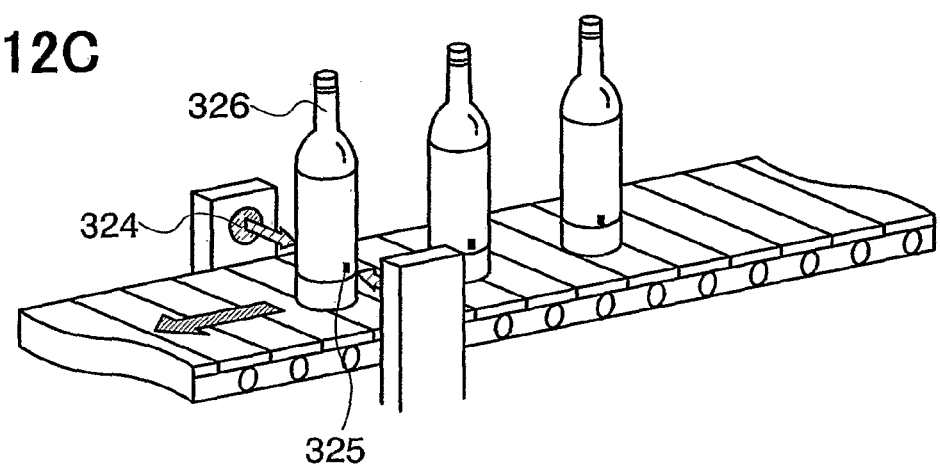

In this embodiment mode, a case of utilizing a semiconductor device of the present invention as an RFID capable of sending/receiving data without contact is described using FIGS. 12A to 12C.

An RFID 80 has a function of communicating data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 12A). Note that the number of memory circuits is not limited to one, and a plurality of memory circuits may be provided. As the memory circuit, an SRAM, a flash memory, a ROM, an FeRAM, or a memory having a memory element portion formed of an organic compound layer may be used.

A signal transmitted as an electric wave from a reader/writer 88 is converted into an AC electrical signal in an antenna 87 by electromagnetic induction. In the power supply circuit 81, a power supply voltage is generated using the AC electrical signal, and the power supply voltage is supplied to each circuit using a power supply wire. In the clock generation circuit 82, various clock signals are generated based on an AC signal input from the antenna 87, and the signals are supplied to the control circuit 85. In the data demodulation circuit 83, the AC electrical signal is demodulated and supplied to the control circuit 85. In the control circuit 85, various arithmetic operations are performed in accordance with the input signals. The memory circuit 86 stores programs, data and the like that are used in the control circuit 85, and can be used as a work area for arithmetic operations and the like. Then, data is sent from the control circuit 85 to the data modulation circuit 84, and load modulation can be added to the antenna 87 in accordance with the data from the data modulation circuit 84. The reader/writer 88 receives load modulation added to the antenna 87 as electric waves, and as a result, data can be read.

Alternatively, RFID may be a type of supplying a power supply voltage to each circuit by an electric wave, without mounting a power source (battery), or may be a type of supplying a power supply voltage to each circuit by an electric wave and a power source (battery), mounting a power source (battery).

When a semiconductor device of the present invention is used in RFID and the like, there are advantages such as the following: non-contact communication is possible; multiple reading is possible; writing data is possible; and processing into various forms is possible; directivity is wide and a wide recognition range is provided depending on a selected frequency. RFID can be applied to an IC tag which can identify individual information of a person or a thing in non-contact wireless communication, a label which can be attached to an article by label processing, a wristband for an event or an amusement, or the like. In addition, RFID may be processed with a resin material and may be directly fixed to a metal obstructing wireless communication. Furthermore, RFID can be utilized for operating a system such as an entering/leaving management system or a checkout system.

Subsequently, one mode of an actual use of a semiconductor device as RFID is described. A reader/writer 320 is provided on a side of a portable terminal including a display portion 321, and an RFID 323 is provided on the side of an article 322 (FIG. 12B). When the reader/writer 320 is held against the RFID 323 included in the article 322, information relating to a product, such as a raw material and a place of origin of the article, a test result in each production process, a history of distribution process, or further, description of the product is displayed in the display portion 321. In addition, a product 326 can be inspected by using a reader/writer 320 and an RFID 325 provided on the product 326 when the product 326 is transported with a belt conveyor (FIG. 12C). In this manner, information can be easily obtained, and high functions and high added values are realized by utilizing RFID for a system.

This embodiment mode can be implemented freely combining with the foregoing Embodiment Modes 1 to 4.

Embodiment Mode 6

The application range of a semiconductor device of the invention is wide and it may be applied to any object if it is an article of which history thereof is revealed without contact and is advantageous in production, management and the like. For example, the semiconductor device of the invention may be incorporated in bills, coins, securities, certificates, bearer bonds, containers for packages, books, recording media, personal belongings, vehicles, foods, clothes, healthcare items, livingware, medicals, and electronic appliances. Examples of these objects will be described with reference to FIGS. 13A to 13H.

Figure 13A:
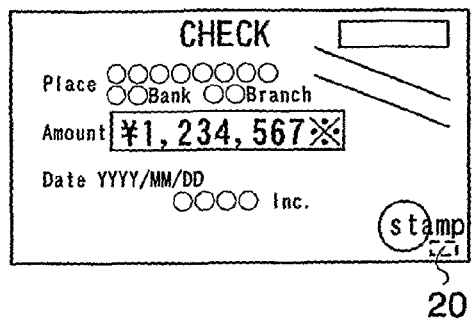
FIGS. 13A to 13H each show an example of a type of usage of a semiconductor device of the present invention.
Figure 13B:
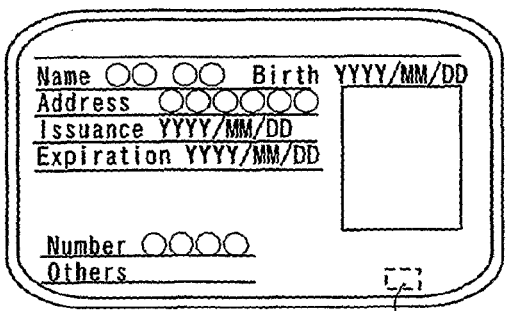
Figure 13C:
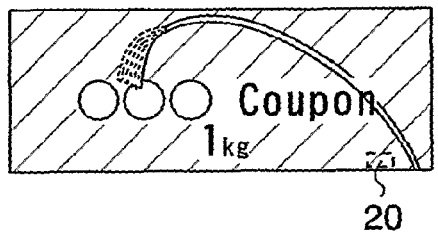
Figure 13D:
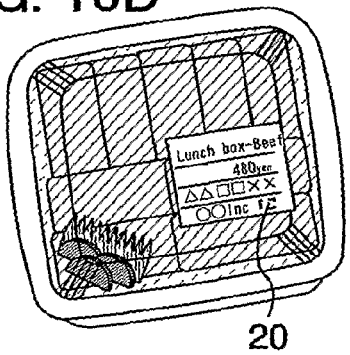
Figure 13E:
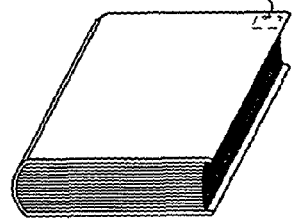
Figure 13F:
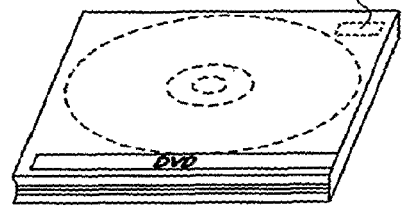
Figure 13G:
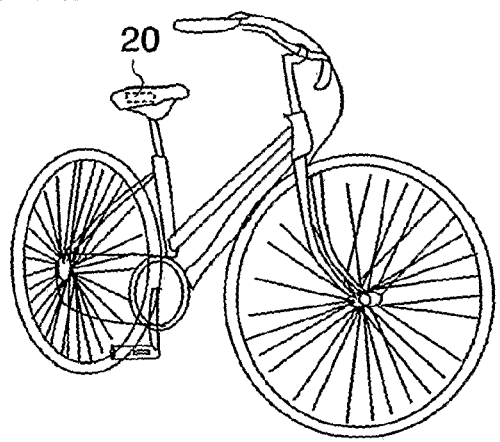
Figure 13H:
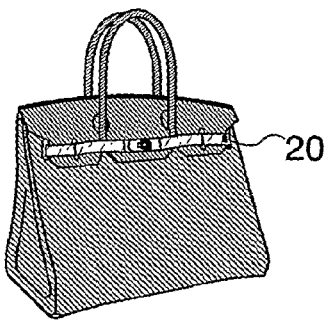
Figure 14A:
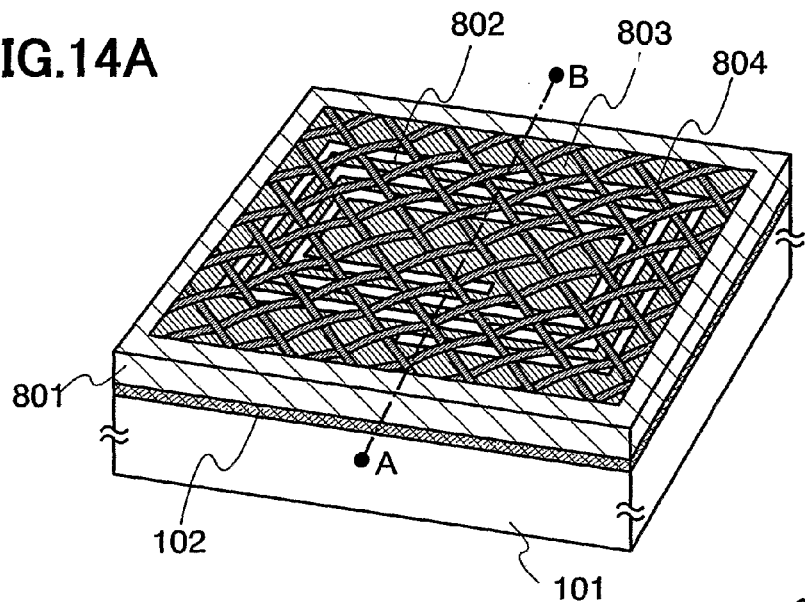
FIGS. 14A to 14C show an example of a manufacturing method of a semiconductor device using a conventional screen printing method.
Figure 14B:
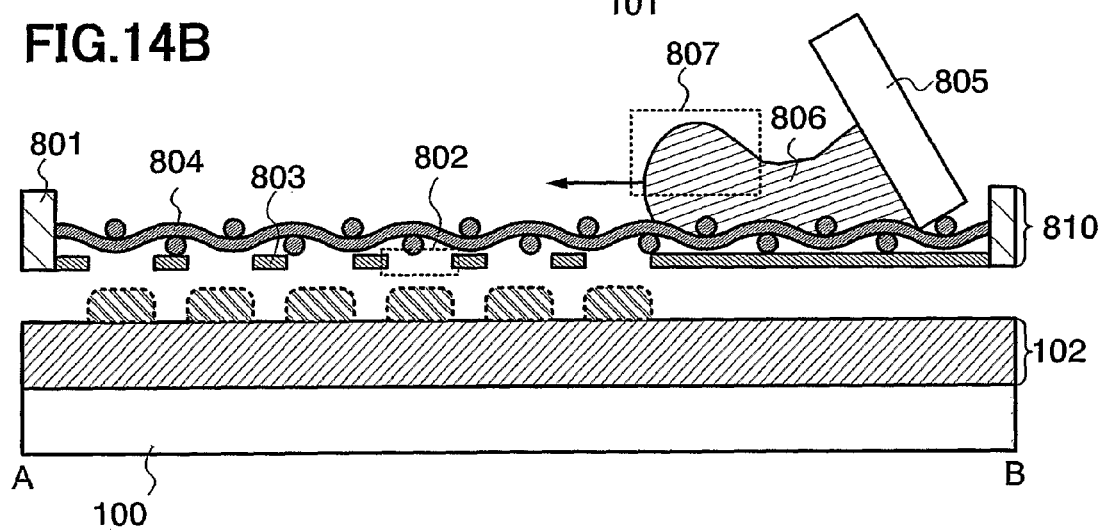
Figure 14C:
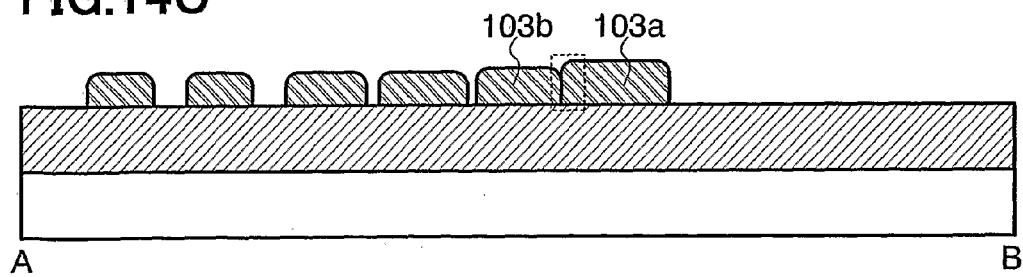

The bills and coins include currency in the market and include a note that is in currency in a specific area as money (cash voucher), memorial coins, and the like. The securities include a check, a certificate, a promissory note, and the like (FIG. 13A). The certificates include a driving license, a resident card, and the like (FIG. 13B). The bearer bonds include a stamp, a rice coupon, various gift coupons, and the like (FIG. 13C). The containers for packages include paper for packing a box lunch or the like, a plastic bottle, and the like (FIG. 13D). The books include a document and the like (FIG. 13E). The recording media include DVD software, a video tape, and the like (FIG. 13F). The vehicles include a wheeled vehicle such as a bicycle, a vessel, and the like (FIG. 13G). The personal belongings include a bag, glasses, and the like (FIG. 13H). The foods include food items, beverages, and the like. The clothes include clothing, footwear, and the like. The healthcare items include a medical device, a health appliance, and the like. The livingware includes furniture, a lighting apparatus, and the like. The medicals include a medicine, an agricultural chemical, and the like. The electronic appliances include a liquid crystal display device, an EL display device, a television set (a television receiver, a thin television receiver), a mobile phone, and the like.

When RFID is provided for bills, coins, securities, certificates, bearer bonds, and the like, forgery of them can be prevented. When RFID is provided for containers for packages, books, recording media, personal belongings, foods, livingware, electronic appliances, and the like, inspection systems, rental systems and the like can be performed more efficiently. When RFID is provided for vehicles, healthcare items, medicals, and the like, forgery and theft of them can be prevented and medicines can be prevented from being consumed in the wrong manner. RFID may be attached to the surface of a product or incorporated into a product. For example, RFID may be provided in the paper of a book, or an organic resin of a package. If data is written (rewritten) by an optical effect afterward, a transparent material is preferably used so that a memory element provided in a chip can be irradiated with light. Furthermore, forgery can be effectively prevented by using a memory element where data cannot be rewritten. Issues such as privacy after a user purchases a product can be dealt with by providing a system for erasing data of a memory element provided in RFID.

In this manner, when RFID is provided for containers for packages, recording media, personal belongings, foods, clothes, livingware, electronic appliances, and the like, inspection system, rental system and the like can be performed more efficiently. RFID also prevents vehicles from being forged or stolen. In addition, when RFID is implanted into creatures such as animals, each creature can be identified easily. For example, when RFID provided with a sensor is implanted into creatures such as domestic animals, not only the year of birth, sex, breed and the like but also the health condition such as the current body temperature can be easily be managed.

As described above, a semiconductor device of the invention can be provided in any object. This embodiment mode can be implemented freely combining with the foregoing embodiment modes.

Note that this embodiment mode can be carried out by freely combining with the foregoing Embodiment Modes 1 to 5.

This application is based on Japanese Patent Application serial No. 2005-160192 filed in Japan Patent Office on May 31, 2005, the entire contents of which are hereby incorporated by reference.

The invention claimed is:

1. A manufacturing method of a semiconductor device comprising:
   forming an element group having a transistor over a substrate; and
   pushing out a paste including conductive particles from a first opening of a screen printing plate to form a first conductive film over the element group,
      subsequently pushing out the paste including the conductive particles from a second opening of the screen printing plate to form a second conductive film functioning as an antenna,
   wherein the first conductive film is formed to be electrically insulated from the transistor; and
   wherein the second conductive film is formed to be electrically connected to the transistor.

2. A manufacturing method of a semiconductor device comprising:
   forming an element group having a transistor over a first substrate; and
   pushing out a paste including conductive particles from a first opening of a screen printing plate to form a first conductive film over a second substrate,
      subsequently pushing out the paste including the conductive particles from a second opening of the screen printing plate to form a second conductive film functioning as an antenna, wherein the first conductive film is formed to be electrically insulated from the transistor; and wherein the second conductive film formed over the second substrate is electrically connected to the transistor.

3. A manufacturing method of a semiconductor device comprising:
   forming an element group having a transistor over a first substrate; and
   pushing out a paste including conductive particles from a first opening of a screen printing plate to form over a second substrate a first conductive film,
      subsequently pushing out the paste including the conductive particles from a second opening portion of the screen printing plate to form a second conductive film functioning as an antenna,
   wherein the first conductive film is formed to be electrically insulated from the transistor; and
   wherein the first substrate and the second substrate are stuck together so that the transistor and the second conductive film functioning as an antenna are electrically connected.

4. The manufacturing method of a semiconductor device according to claim 3, wherein conductive particles are to connect the transistor and the second conductive film functioning as an antenna.

5. The manufacturing method of a semiconductor device according to any one of claims 1 to 3, wherein the second conductive film is formed in a coil form.

6. The manufacturing method of a semiconductor device according to any one of claims 1 to 3, wherein as the screen printing plate, a screen printing plate in which a width of the first opening is wider than a width of the second opening portion is used.

7. The manufacturing method of a semiconductor device according to any one of claims 1 to 3, wherein a width of the first conductive film to be wider than a width of the second conductive film functioning as an antenna is formed.

8. The manufacturing method of a semiconductor device according to any one of claims 1 to 3, further comprising baking the paste pushed out from the first opening and the paste pushed out from the second opening to form the first conductive film and the second conductive film functioning as an antenna.

9. A semiconductor device comprising:
   an element group having a transistor, provided over a substrate;
   a first conductive film formed over the element group and electrically insulated from the transistor; and
   a second conductive film functioning as an antenna provided adjacent to the first conductive film and provided to be electrically connected to the transistor.

10. A semiconductor device comprising:
    an element group having a transistor, provided over a substrate;
    a first conductive film provided over the element group and electrically insulated from the transistor; and
    a second conductive film functioning as an antenna provided adjacent to the first conductive film and provided to be electrically connected to the transistor,
    wherein the second conductive film is in a coil form;
    wherein the first conductive film is bent and has a first end portion and a second end portion; and
    wherein the first end portion and the second end portion are not connected.

11. The semiconductor device according to claim 9 or claim 10, wherein the second conductive film is provided on an outer side of a region in which the first conductive film is positioned, and is non-circular.

12. The semiconductor device according to claim 9 or 10, wherein the first conductive film has a width wider than a width of the second conductive film.

13. The semiconductor device according to claim 9 or 10, wherein the transistor and the first conductive film are connected via conductive particles.

14. A semiconductor device comprising:
    an element group having a transistor, provided over a substrate; and
    one coil-formed conductive film functioning as an antenna provided over the element group and is electrically connected to the transistor,
    wherein a width of a portion of the conductive film positioned in an outermost circumference is wider than a width of a portion positioned on an inner side.

15. A manufacturing method of an antenna comprising:
    pushing out a paste including conductive particles from a first opening of a screen printing plate to form over a substrate a first conductive film,
    subsequently pushing out the paste including the conductive particles from a second opening of the screen printing plate to form a second conductive film functioning as an antenna,
    wherein the first conductive film and the second conductive film are formed to be electrically insulated from each other.

16. The manufacturing method of an antenna according to claim 15, wherein forming the second conductive film is formed in a coil form.

17. The manufacturing method of an antenna according to claim 15 or claim 16, wherein as the screen printing plate, a screen printing plate in which a width of the first opening is wider than a width of the second opening portion is used.

18. The manufacturing method of an antenna according to claim 15 or claim 16, further comprising forming a width of the first conductive film to be wider than a width of the second conductive film functioning as an antenna.

19. The manufacturing method of an antenna according to claim 15 or claim 16, further comprising baking the paste pushed out from the first opening and the paste pushed out from the second opening to form the first conductive film and the second conductive film functioning as an antenna.

20. The manufacturing method of a semiconductor device according to any one of claims 1 to 3, further comprising:
    cutting off the substrate to remain the first and second conductive films on the same surface.

21. The semiconductor device according to claim 9 or claim 10, wherein the second conductive film is formed over the element group.

22. The semiconductor device according to claim 9 or claim 10, wherein a square of a rear surface of the semiconductor device is 0.09 $cm^2$ to 4 $cm^2$.

23. The semiconductor device according to claim 9 or claim 10, wherein a width of the second conductive film is 50 μm or more and 400 μm or less.

24. The semiconductor device according to claim 9 or claim 10, wherein a third conductive film adjacent to the second conductive film and over substrate; and
    wherein an interval between the second conductive film and the third conductive film is 100 μm or less.

* * * * *